(12) United States Patent
Yanase et al.

(10) Patent No.: US 7,525,399 B2
(45) Date of Patent: Apr. 28, 2009

(54) THIN-FILM PIEZOELECTRIC RESONATOR, FILTER AND VOLTAGE-CONTROLLED OSCILLATOR

(75) Inventors: Naoko Yanase, Kawasaki (JP); Kenya Sano, Kawasaki (JP); Takaaki Yasumoto, Kawasaki (JP); Ryoichi Ohara, Kawasaki (JP); Kazuhiko Itaya, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 294 days.

(21) Appl. No.: 11/376,266

(22) Filed: Mar. 16, 2006

(65) Prior Publication Data
US 2006/0267711 A1 Nov. 30, 2006

(30) Foreign Application Priority Data
May 31, 2005 (JP) ............................. 2005-160242

(51) Int. Cl.
*H03H 9/54* (2006.01)
*H03H 9/15* (2006.01)

(52) U.S. Cl. .................. 333/189; 333/187; 310/324; 310/335

(58) Field of Classification Search ............ 333/189, 333/187, 133; 310/324, 349, 335
See application file for complete search history.

(56) References Cited

U.S. PATENT DOCUMENTS

| | | | |
|---|---|---|---|
| 6,060,818 A | 5/2000 | Ruby et al. | |
| 6,548,942 B1 | 4/2003 | Panasik | |
| 6,556,103 B2 * | 4/2003 | Shibata et al. | 333/187 |
| 6,670,866 B2 * | 12/2003 | Ella et al. | 333/133 |
| 6,734,763 B2 * | 5/2004 | Nishihara et al. | 333/187 |
| 6,885,262 B2 * | 4/2005 | Nishimura et al. | 333/189 |

(Continued)

FOREIGN PATENT DOCUMENTS

EP 1 306 973 A2 5/2003

(Continued)

OTHER PUBLICATIONS

Kenneth M. Lakin, et al., "Development of Miniature Filters for Wireless Applications", IEEE Transactions on Microwave Theory and Techniques, vol. 43, No. 12, Dec. 1995, pp. 2933-2939.

(Continued)

*Primary Examiner*—Barbara Summons
(74) *Attorney, Agent, or Firm*—Oblon, Spivak, McClelland, Maier & Neustadt, P.C.

(57) ABSTRACT

A thin-film piezoelectric resonator includes a substrate, and first and second excitation portions. The substrate includes first and second cavities. The first excitation portion is disposed over the first cavity, and includes a first electrode, a first piezoelectric material and a second electrode laminated successively. An overlapping region among the first electrode, the first piezoelectric material and the second electrode defines a contour of a periphery of the first excitation portion. A first distance is defined as a distance from an end of the first excitation portion to an opening end of the first cavity. The second excitation portion is disposed over the second cavity, and includes a third electrode, a second piezoelectric material and a fourth electrode laminated successively. A second distance is defined as a distance from an end of the second excitation portion to an opening end of the second cavity and different from the first distance.

11 Claims, 29 Drawing Sheets

U.S. PATENT DOCUMENTS

| | | | | |
|---|---|---|---|---|
| 6,909,340 B2 * | 6/2005 | Aigner et al. | ................ | 333/189 |
| 7,145,417 B2 * | 12/2006 | Kimachi et al. | ............. | 333/189 |
| 7,161,447 B2 * | 1/2007 | Nomura et al. | ............. | 333/187 |
| 7,235,915 B2 * | 6/2007 | Nakamura et al. | ........... | 310/335 |
| 7,242,130 B2 * | 7/2007 | Nakamura et al. | ........... | 310/320 |

FOREIGN PATENT DOCUMENTS

JP      2000-69594      3/2000

OTHER PUBLICATIONS

T. Nishihara, et al., "High Performance and Miniature Thin Film Bulk Acoustic Wave Filters for 5GHz", Proc. IEEE Ultrasonics Symposium, 2002, pp. 969-972.

Robert Aigner, et al., "Bulk-Acoustic-Wave Filters: Performance Optimization and Volume Manufacturing", IEEE MTT-S Digest TH5D-4, 2003, pp. 2001-2004.

U.S. Appl. No. 11/675,811, filed Feb. 16, 2007, Sano, et al.

U.S. Appl. No. 10/581,030, filed May 30, 2006, Ohara, et al.

U.S. Appl. No. 11/447,999, filed Jun. 7, 2006, Ohara, et al.

\* cited by examiner

| THIN-FILM PIEZOELECTRIC RESONATOR | CAPACITANCE RATIO |
|---|---|
| 31 (C1) | 1.00 |
| 32 (C2) | 0.94 |
| 33 (C3) | 0.49 |
| 34 (C4) | 0.94 |
| 35 (C5) | 0.49 |
| 36 (C6) | 0.94 |
| 37 (C7) | 1.00 |

FIG. 15

| | DISTRIBUTION OF d [μm] | SIDE DISTRIBUTION OF SQUARE CAVITY [μm] | ETCHING TIME [MIN.] | OVER-ETCHING TIME [MIN.] | MAXIMUM NOTCH AMOUNT [μm] | PARASTIC CAPACITANCE CHANGE [%] | SUPRIOUS SUPPRESSION EFFECT |
|---|---|---|---|---|---|---|---|
| 1ST EXAMPLE | 10-35 | 185 | 43 | 1.5 | 3 | 2.5 | ○ |
| 2ND EXAMPLE | 10-44 | 185 | 43 | 1.5 | 3 | 0 | ◎ |
| 3RD EXAMPLE | 10-35 | 185 | 43 | 1.5 | 3 | 1.8 | ◎ |
| 1ST COMPARATIVE EXAMPLE | 10 | 135-185 | 65 | 8 | 16 | 10 | × |
| 2ND COMPARATIVE EXAMPLE | 10 | 116-185 | 72 | 10 | 23 | 0 | △ |
| 3RD COMPARATIVE EXAMPLE | 10 | 135-185 | 65 | 10 | 16 | 10 | × |

FIG. 19

| THIN-FILM PIEZOELECTRIC RESONATOR | CAPACITANCE RATIO |
|---|---|
| C1 | 1.00 |
| C2 | 0.69 |
| C3 | 0.98 |
| C4 | 0.80 |
| C5 | 0.34 |
| C6 | 0.82 |

FIG. 26

| THIN-FILM PIEZOELECTRIC RESONATOR | CAPACITANCE RATIO |
|---|---|
| 31 (C1) | 1.00 |
| 32 (C2) | 1.00 |
| 33 (C3) | 1.00 |
| 34 (C4) | 0.67 |
| 35 (C5) | 0.67 |
| 36 (C6) | 0.67 |
| 37 (C7) | 1.00 |
| 38 (C8) | 1.00 |
| 39 (C9) | 1.00 |

THIN-FILM PIEZOELECTRIC RESONATOR, FILTER AND VOLTAGE-CONTROLLED OSCILLATOR

This application is based upon and claims the benefit of priority from the prior Japanese Patent Application No.2005-160242 filed on May 31, 2005; the entire contents of which are incorporated herein by reference.

BACKGROUND OF THE INVENTION

1. Field of the Invention

The present invention relates to a thin-film piezoelectric resonator, a filter and a voltage-controlled oscillator. Particularly, the invention relates to a thin-film piezoelectric resonator using longitudinal vibration in a direction of thickness of a piezoelectric thin film, a filter provided with the thin-film piezoelectric resonator, and a voltage-controlled oscillator provided with the filter.

2. Description of the Related Art

A surface acoustic wave (hereinafter referred to as "SAW" simply) device is used in a radio frequency (RF) filter or an intermediate frequency (IF) filter for forming a mobile communication apparatus or a voltage-controlled oscillator (hereinafter referred to as "VCO" simply) included in the mobile communication apparatus. Because the resonance frequency of the SAW device is inversely proportional to the distance between comb-shaped electrodes, the distance between comb-shaped electrodes is not longer than 1 μm in a frequency region exceeding 1 GHz. For this reason, the SAW device is apt to be hard to use when the frequency to be used becomes high.

As a substitute for the SAW device, a thin-film piezoelectric resonator using a longitudinal vibration mode in a direction of the film thickness of a thin-film piezoelectric material has attracted public attention in recent years. The thin-film piezoelectric resonator is called FBRA (Film Bulk Acoustic Resonator) or BAW (Bulk Acoustic Resonator). In the thin-film piezoelectric resonator, the resonance frequency is decided on the basis of the acoustic velocity and film thickness of the thin-film piezoelectric material. Generally, a resonance frequency of 2 GHz is obtained when the film thickness of the thin-film piezoelectric resonator is in a range of from 1 μm to 2 μm. A resonance frequency of 5 GHz is obtained when the film thickness of the thin-film piezoelectric resonator is in a range of from 0.4 μm to 0.8 μm. Accordingly, increase in frequency up to tens of GHz can be achieved in the recent film-forming technique.

A technique in which a ladder-type filter 102 formed of thin-film piezoelectric resonators 101 as shown in FIG. 39 is used as an RF filter of a mobile communication apparatus has been disclosed in IEEE TRANSECTIONS ON MICROWAVE THEORY AND TECHNIQUES, VOL. 43, NO. 12, p. 2933, DECEMBER 1995. The ladder-type filter 102 is formed of thin-film piezoelectric resonators 101 connected in series and in parallel between an input terminal $P_{in}$ and an output terminal $P_{out}$. As shown in FIG. 40, a thin-film piezoelectric resonator 101 can be combined with a variable capacitor 104 and an amplifier 105 to form a VCO 103 of a mobile communication apparatus.

A structure of a currently most typical thin-film piezoelectric resonator and a method for producing the thin-film piezoelectric resonator have been disclosed in JP 2000-69594 A. The method for producing the thin-film piezoelectric resonator is as follows. First, a hollow is formed in a surface of a silicon (Si) substrate by anisotropic etching. A sacrificial layer is then formed on the substrate. For example, a boron phosphorus-doped silicate glass (BPSG) layer is used as the sacrificial layer. Then, a surface of the sacrificial layer is polished till the surface of the Si substrate is exposed, so that the surface of the sacrificial layer is flattened. As a result, while the sacrificial layer is embedded in the hollow preliminarily formed in the Si substrate, the surface of the Si substrate around the sacrificial layer can be exposed. A lower electrode, a piezoelectric material and an upper electrode are further laminated successively on the sacrificial layer. Then, a hole is formed till the sacrificial layer. The sacrificial layer is removed by selective etching through the hole, so that a cavity corresponding to the preliminarily formed hollow is formed between the Si substrate and the lower electrode. When these series of production steps is completed, a thin-film piezoelectric resonator is finished.

Proc. IEEE Ultrasonics Symposium, pp. 969-972 (2002) discloses a technique for producing a thin-film piezoelectric resonator in such a manner that a piezoelectric thin film sandwiched between upper and lower electrodes is formed on the front surface of a Si wafer and a cavity is formed in the rear surface of the Si wafer by silicon deep reactive ion etching (Si-Deep-RIE). Zinc oxide (ZnO), aluminum nitride (AlN) or the like is used in the piezoelectric thin film.

On the other hand, IEEEMTT-S Digest TH5D-4, pp. 2001-2004 discloses a thin-film piezoelectric resonator provided with an acoustic reflection layer instead of the cavity. A method for producing the thin-film piezoelectric resonator is as follows. First, a hollow is formed in a surface of a Si substrate. Films high in acoustic impedance and films low in acoustic impedance are laminated alternately on the surface of the Si substrate to thereby form an acoustic reflection layer. The acoustic reflection layer is then polished till the acoustic reflection layer is embedded in the hollow of the substrate so that the surface of the substrate is flattened. A lower electrode, a piezoelectric thin film and an upper electrode are laminated on the acoustic layer embedded in the hollow. Thus, a thin-film piezoelectric resonator can be finished.

In the thin-film piezoelectric resonator, the filter formed of the thin-film piezoelectric resonators and the voltage-controlled oscillator formed in the filter, there is however no consideration about the following point.

The thin-film piezoelectric resonator uses a structure in which a lower electrode, a piezoelectric material and an upper electrode are laminated successively on a cavity or acoustic reflection layer disposed in a substrate and in which an overlapping region among the cavity or acoustic reflection layer, the lower electrode, the piezoelectric material and the upper electrode serves as an excitation portion. The opening shape and opening size of the cavity or the planar contour shape and contour size of the acoustic reflection layer with respect to the planar shape and planar size of the excitation portion is affected by change in production process condition of the thin-film piezoelectric resonator. That is, if the production process condition changes, variation occurs in the frequency pass characteristic of filters formed of thin-film piezoelectric resonators produced before and after the change.

In the ladder-type filter 102 shown in FIG. 39, the number of ladder steps, the sequence of series and parallel connections, the capacitance value of each thin-film piezoelectric resonator 101, the length of connection wiring, etc. are important parameters on designing the filter function. It is necessary to adjust the input/output impedance of the filter to the requirement of the circuit to be designed. Generally, the input/output impedance of the filter is set to be 50Ω. The number of thin-film piezoelectric resonators 101 for forming one filter and respective capacitance values of the thin-film piezoelectric resonators 101 are decided in accordance with the requirement on designing the filter circuit. The capacitance value of each thin-film piezoelectric resonator 101 is proportional to the planar size (planar area) of the excitation portion. The ladder-type filter 102 is formed of a combination of thin-film piezoelectric resonators 101 having excitation portions of various planer sizes.

When thin-film piezoelectric resonators 101 having small capacitance values are combined on design of the ladder-type filter 102, it is not good to combine thin-film piezoelectric resonators 101 having excitation portions of small planer sizes. If the planar size of each excitation portion is small, the rate of the peripheral length to the planar area of the excitation portion becomes large. Increase in the rate of the peripheral length brings increase in the rate of release of vibration energy from the periphery of the excitation portion. In an excitation portion small in planar area relative to an excitation portion large in planar area, the resonance characteristic shows a tendency toward deterioration because of increase in energy loss. To avoid this tendency, excitation portions (thin-film piezoelectric resonators 101) having double capacitance values are connected in series to design the ladder-type filter 102 so that the planar area of the excitation portion of one thin-film piezoelectric resonator 101 is prevented from becoming too small.

Conversely, when a thin-film piezoelectric resonator 101 having a large capacitance value is required, the rate of release of vibration energy can be reduced but a risk of breaking caused by shortage of mechanical strength (film strength) supporting the excitation portion, deterioration of resonance characteristic caused by distortion, etc. occur in the thin-film piezoelectric resonator 101 having the excitation portion supported on the cavity. To avoid the risk of breaking and deterioration of vibration characteristic, excitation portions (thin-film piezoelectric resonators 101) having half capacitance values are connected in parallel to design the ladder-type filter 102 so that the planar area of the excitation portion of one thin-film piezoelectric resonator 101 is prevented from becoming too large. The planar area of the excitation portion however varies even in the case where the capacitance value of each excitation portion is adjusted on the basis of the requirement on design of the filtering characteristic or the requirement on the characteristic of each thin-film piezoelectric resonator 101.

From the viewpoint of the structure of each thin-film piezoelectric resonator 101, the opening size of the cavity or the contour size of the acoustic reflection layer needs to be larger by a length enough to attenuate vibration energy leaked from the periphery of the excitation portion than the planar size of the excitation portion. At the least, the cavity or acoustic reflection layer is provided to surround the excitation portion with a predetermined distance kept between the cavity or acoustic reflection layer and the excitation portion. In this case, in the ladder-type filter 102 formed of a plurality of thin-film piezoelectric resonators 101, cavities different in opening size or acoustic reflection layers different in contour size are produced in accordance with the thin-film piezoelectric resonators 101. As a result, the following problem occurs.

As shown in FIG. 41, in the process for producing the thin-film piezoelectric resonator 101 disclosed in JP 2000-69594 A, dishing 113 in which the hollow in the surface of each sacrificial layer 112 becomes large in the cavity 111 as the opening size becomes large occurs easily after the flattening and polishing process in which the sacrificial layers 112 are embedded in the cavities 111 different in opening size in the substrate 110. As shown in FIG. 42, erosion 114 in which the surface of the substrate 110 in the sacrificial layer 112 and its periphery in each cavity 111 is eroded as the opening size decreases occurs easily. Dishing 113 or erosion 114 deteriorates the flatness of the surface (surface of the substrate 110) of the sacrificial layer 112 to thereby deteriorate the crystallinity of the lower electrode and the piezoelectric material formed on the surface of the sacrificial layer 112.

Moreover, in the process for removing the sacrificial layer 112, the volume of the removed sacrificial layer 112 varies according to the opening size of the cavity 111. Accordingly, the etching time to remove the sacrificial layer 112 varies according to the cavity 111, so that it is difficult to set the end point of etching. Moreover, when etching advances based on a chemical reaction, the state of supply of etchant varies according to the arrangement position of the thin-film piezoelectric resonator 101 in the ladder-type filter 102, so that the etching speed of the sacrificial layer 112 varies according to the thin-film piezoelectric resonator 101. Specifically, the concentration of etchant varies locally in between the sacrificial layer 112 of the thin-film piezoelectric resonator 101 disposed in the center position and the sacrificial layer 112 of the thin-film piezoelectric resonator 101 disposed in the periphery of the center position, so that the etching speeds of the two are different from each other. It is difficult to set the end point of etching also because of such variation in etching speed. To remove all the sacrificial layers 112, an excessive time is taken for etching.

In the process for producing the thin-film piezoelectric resonator 101 disclosed in Proc. IEEE Ultrasonics Symposium, pp. 969-972 (2002), a micro-loading effect occurs easily at the time of etching when the cavity 111 is formed in the rear surface of the substrate 110 just below the excitation portion by the Si-Deep-RIE process after the excitation portion is formed by laminating the lower electrode, the piezoelectric material and the upper electrode on the substrate 110. The micro-loading effect is a phenomenon that the etching speed in the cavity 111 small in opening size becomes slower than the etching speed in the cavity 111 large in opening size. If the condition is set so that etching can be perfectly completed in cavity 111 small in opening size, the over-etching time in the cavity 111 large in opening size becomes so long that tunneling just above the stopper layer 115, that is, a notch 116 is generated easily as shown in FIG. 43.

Moreover, the etching speed varies according to the density of arrangement of the cavity 111 like wet etching. In the ladder-type filter 102, the etching speed in the sacrificial layer in the cavity 111 of one thin-film piezoelectric resonator 101 is different from the etching speed in the sacrificial layer in the cavity 111 of the other thin-film piezoelectric resonator 101 disposed around the first-mentioned thin-film piezoelectric resonator 101. Also in such a case, increase in over-etching time is brought according to the arrangement position of the cavity 111, so that the notch 116 is generated in the cavity 111 of the other thin-film piezoelectric resonator 101. Because the generation of the notch 116 changes the opening size of the cavity 111 to thereby change the parasitic capacitance value added to the excitation portion (piezoelectric capacitor), the frequency characteristic of the ladder-type filter 102 changes.

Moreover, in the ladder-type filter 102, because cavities 111 of thin-film piezoelectric resonators 101 are disposed adjacently, such notches 116 make the wall between adjacent cavities 111 so thin that the mechanical strength of the substrate 110 is weakened due to destruction of the wall as the case may be. Moreover, because the large notch 116 changes the opening end shape of the cavity 111 to a concavo-convex shape in which concentration of stress occurs easily, mechanical strength against breaking of the thin film of the excitation portion is weakened. Moreover, if the excitation portion abuts on the concavo-convex portion of the opening end caused by the notch 116, spurious response occurs in resonance characteristic so that the filtering characteristic of the ladder-type filter 102 deteriorates.

In the process of producing the thin-film piezoelectric resonator 101 disclosed in IEEE MTT-S Digest TH5D-4. pp. 2001-2004, the crystallinity of the lower electrode and the piezoelectric material formed on the surface of the acoustic reflection layer deteriorates because dishing 113 or erosion 114 occurs easily in accordance with the flattening and polishing process of the acoustic reflection layer embedded in the substrate in the same manner as in the process of producing the thin-film piezoelectric resonator 101 disclosed in JP 2000 69594 A.

SUMMARY OF THE INVENTION

Under these circumstances, the invention has been made. The invention provides a thin-film piezoelectric resonator in which the crystallinity of an excitation portion disposed on each cavity or acoustic reflection layer can be improved so that variation in capacitance value of the excitation portion can be reduced.

Further, the invention provides a filter and a voltage-controlled oscillator formed of the thin-film piezoelectric resonators, in which filtering characteristic can be improved.

According to a first aspect of the invention, a thin-film piezoelectric resonator includes a substrate, a first excitation portion and a second excitation portion. The substrate includes a first cavity and a second cavity disposed separately from each other. The first excitation portion is disposed over the first cavity. The first excitation portion includes a first electrode, a first piezoelectric material and a second electrode laminated successively. An overlapping region among the first electrode, the first piezoelectric material and the second electrode defines a contour of a periphery of the first excitation portion. A first distance is defined as a distance from an end of the first excitation portion to an opening end of the first cavity. The second excitation portion is disposed over the second cavity. The second excitation portion includes a third electrode, a second piezoelectric material and a fourth electrode laminated successively. An overlapping region among the third electrode, the second piezoelectric material and the fourth electrode defines a contour of a periphery of the second excitation portion. A second distance is defined as a distance from an end of the second excitation portion to an opening end of the second cavity. The second distance is different from the first distance.

According to a second aspect of the invention, a filter includes a substrate, a first thin-film piezoelectric resonator and a second thin-film piezoelectric resonator. The substrate includes a first cavity and a second cavity disposed separately from each other. The first thin-film piezoelectric resonator includes a first excitation portion disposed over the first cavity. The first excitation portion includes a first electrode, a first piezoelectric material and a second electrode laminated successively. An overlapping region among the first electrode, the first piezoelectric material and the second electrode defines a contour of a periphery of the first excitation portion. A first distance is defined as a distance from an end of the first excitation portion to an opening end of the first cavity. The second thin-film piezoelectric resonator includes a second excitation portion disposed over the second cavity. The second excitation portion includes a third electrode, a second piezoelectric material and a fourth electrode laminated successively. An overlapping region among the third electrode, the second piezoelectric material and the fourth electrode defines a contour of a periphery of the second excitation portion. A second distance is defined as a distance from an end of the second excitation portion to an opening end of the second cavity. The second distance is different from the first distance.

According to a third aspect of the invention, a filter includes a substrate, a first thin-film piezoelectric resonator and a second thin-film piezoelectric resonator. The substrate includes a first cavity and a second cavity disposed separately from each other. The first thin-film piezoelectric resonator includes a first excitation portion disposed over the first cavity. The first excitation portion includes a first electrode, a first piezoelectric material and a second electrode laminated successively. An overlapping region among the first electrode, the first piezoelectric material and the second electrode defines a contour of a periphery of the first excitation portion. The second thin-film piezoelectric resonator includes a second excitation portion disposed over the second cavity. The second excitation portion including a third electrode, a second piezoelectric material and a fourth electrode laminated successively. An overlapping region among the third electrode, the second piezoelectric material and the fourth electrode defines a contour of a periphery of a second excitation portion. An opening shape of the first cavity is the same as an opening shape of the second cavity. An opening size of the first cavity is the same as an opening size of the second cavity.

According to a fourth aspect of the invention, a filter includes a substrate, a first thin-film piezoelectric resonator and a plurality of second thin-film piezoelectric resonators. The substrate includes a first cavity and a plurality of second cavities disposed separately from each other. The second cavities are disposed around the first cavity. The first thin-film piezoelectric resonator includes a first excitation portion disposed over the first cavity. The first excitation portion includes a first electrode, a first piezoelectric material and a second electrode laminated successively. An overlapping region among the first electrode, the first piezoelectric material and the second electrode defines a contour of a periphery of the first excitation portion. The second thin-film piezoelectric resonators each includes a second excitation portion disposed over the second cavity. Each second excitation portion includes a third electrode, a second piezoelectric material and a fourth electrode laminated successively. An overlapping region among the third electrode, the second piezoelectric material and the fourth electrode defines a contour of a periphery of each second excitation portion. An opening size of the first cavity is larger than an opening size of each of the second cavities.

According to a fifth aspect of the invention, a thin-film piezoelectric resonator includes a substrate, a first excitation portion and a second excitation portion. The substrate includes a first acoustic reflection layer and a second acoustic reflection layer disposed separately from each other. The first excitation portion is disposed on the first acoustic reflection layer. The first excitation portion includes a first electrode, a first piezoelectric material and a second electrode laminated successively. An overlapping region among the first electrode, the first piezoelectric material and the second electrode defines a contour of a periphery of the first excitation portion. A first distance is defined as a distance from an end of the first excitation portion to a contour end of the first acoustic reflection layer. The second excitation portion is disposed on the second acoustic reflection layer. The second excitation portion includes a third electrode, a second piezoelectric material and a fourth electrode laminated successively. An overlapping region among the third electrode, the second piezoelectric material and the fourth electrode defines a contour of a periphery of the second excitation portion. A second distance is defined as a distance from an end of the second excitation portion to a contour end of the second acoustic reflection layer. The second distance is different from the first distance.

According to a sixth aspect of the invention, a filter includes a substrate, a first thin-film piezoelectric resonator and a second thin-film piezoelectric resonator. The substrate includes a first acoustic reflection layer and a second acoustic reflection layer disposed separately from each other. The first thin-film piezoelectric resonator includes a first excitation portion disposed on the first acoustic reflection layer. The first excitation portion includes a first electrode, a first piezoelectric material and a second electrode laminated successively. An overlapping region among the first electrode, the first piezoelectric material and the second electrode defines a contour of a periphery of the first excitation portion. A first distance is defined as a distance from an end of the first excitation portion to a contour end of the first acoustic reflection layer. The second thin-film piezoelectric resonator includes a second excitation portion disposed on the second acoustic reflection layer. The second excitation portion includes a third electrode, a second piezoelectric material and a fourth electrode laminated successively. An overlapping region among the third electrode, the second piezoelectric material and the fourth electrode defines a contour of a periphery of the second excitation portion. A second distance is defined as a distance from an end of the second excitation portion to a contour end of the second acoustic reflection layer. The second distance is different from a first distance.

According to the above-described configurations, it is possible to improve crystallinity of the excitation portions disposed on the cavities or acoustic reflection layers, so that variation in capacitance values of the excitation portions can be reduced.

Also, it is also possible to provide a filter and a voltage-controlled oscillator formed of thin-film piezoelectric resonators, in which filtering characteristic can be improved.

BRIEF DESCRIPTION OF THE DRAWINGS

FIG. 15 is a table showing the design item, etching condition and effect of the thin-film piezoelectric resonators according to first to third examples of the first embodiment of the invention.

FIG. 19 is a table showing capacitance ratios of respective thin-film piezoelectric resonators in the filter according to the second example.

FIG. 26 is a table showing capacitance ratios of thin-film piezoelectric resonators in the filter depicted in FIG. 25.

DETAILED DESCRIPTION OF EMBODIMENTS OF THE INVENTION

Embodiments of the invention will be described below in detail with reference to the drawings. In the following description, like numerals refer to like parts for the sake of omission of duplicated description.

First Embodiment

[Structure of Thin-Film Piezoelectric Resonator]

Figure 1:
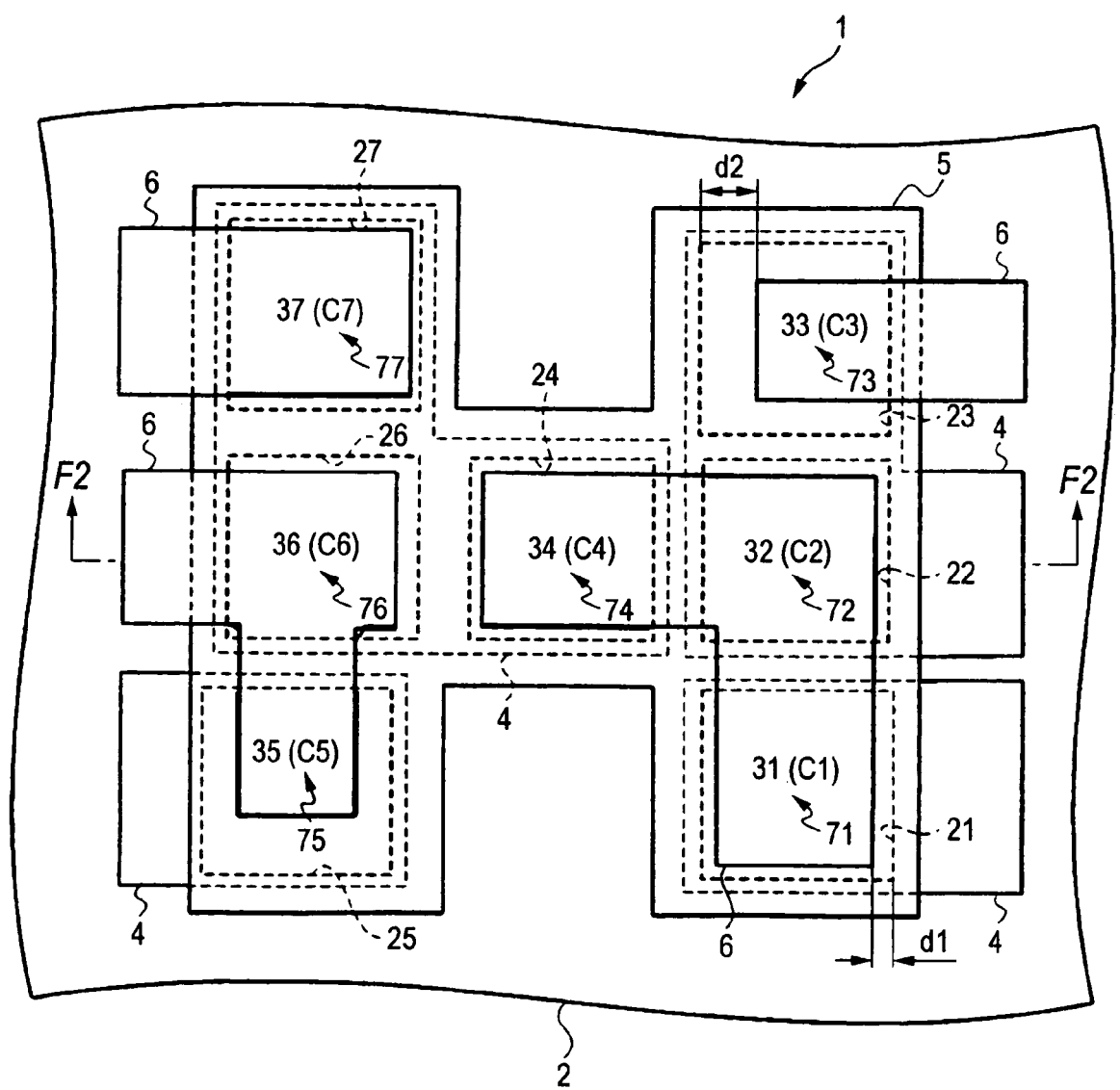
FIG. 1 is a plan view of thin-film piezoelectric resonators and a filter according to a first embodiment of the invention.
Figure 2:
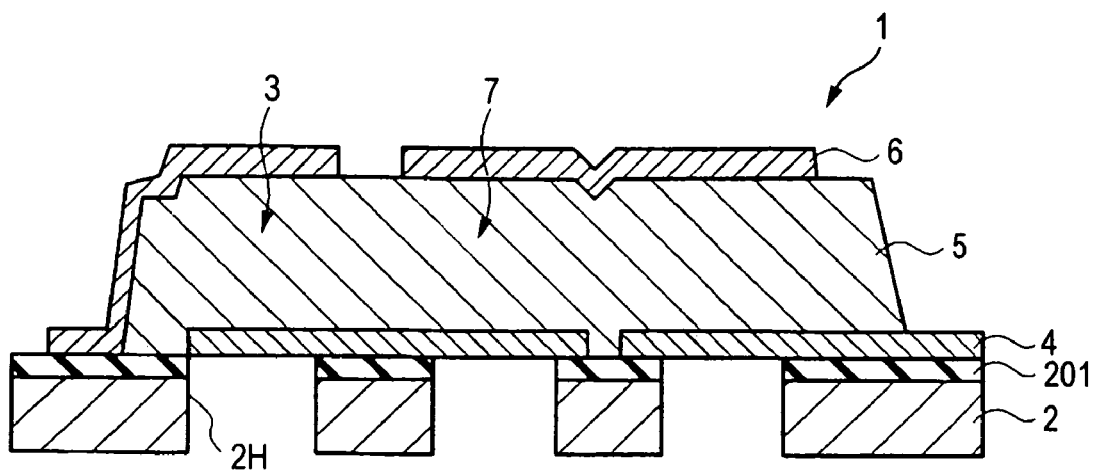
FIG. 2 is a sectional view of the thin-film piezoelectric resonators and the filter cut in the line F2-F2 shown in FIG. 1.

As shown in FIGS. 1 and 2, a filter (thin-film piezoelectric resonator filter) 1 according to a first embodiment includes a substrate 2, thin-film piezoelectric resonators (serving as first thin-film piezoelectric resonators) 31, 32, 34, 36 and 37, and thin-film piezoelectric resonators (serving as second thin-film piezoelectric resonators) 33 and 35. The substrate 2 includes cavities (serving as first cavities) 21, 22, 24, 26 and 27, and cavities (serving as second cavities) 23 and 25 disposed separately from one another. The first thin-film piezoelectric resonators 31, 32, 34, 36 and 37 include excitation portions (serving as first excitation portions) 71, 72, 74, 76 and 77 disposed over the first cavities 21, 22, 24, 26 and 27, respectively. Each of the first excitation portions 71, 72, 74, 76 and 77 is formed in such a manner that a lower electrode (serving as first electrode) 4, a piezoelectric material (serving as first piezoelectric material) 5 and an upper electrode (serving as second electrode) 6 are laminated successively. Regions where the layers 4, 5 and 6 overlap one another define the contours of each first excitation portion. The second thin-film piezoelectric resonators 33 and 35 include excitation portions (serving as second excitation portions) 73 and 75 disposed over the second cavities 23 and 25, respectively. Each of the second excitation portions 73 and 75 is formed in such a manner that a lower electrode (serving as third electrode) 4, a piezoelectric material (serving as second piezoelectric material) 5 and an upper electrode (serving as fourth electrode) 6 are laminated successively. Regions where the layers 4, 5 and 6 overlap one another define the contours of each second excitation portion. In the filter 1, an average distance (second average distance) d2, which is an average of distances from ends of the excitation portions 73 and 75 to opening ends of the cavities 23 and 25, is longer by at least an alignment tolerance than an average distance (first average distance) d1, which is an average of distances from ends of the excitation portions 71, 72, 74, 76 and 77 to opening ends of the cavities 21, 22, 24, 26 and 27.

The number of thin-film piezoelectric resonators arranged in the filter 1 according to the first embodiment is not limited to the aforementioned number. In FIG. 1, seven thin-film piezoelectric resonators 31 to 37 are combined to form the filter 1. That is, a thin-film piezoelectric resonator 34 is disposed in the center of the filter 1. Thin-film piezoelectric resonators 31 to 33 are disposed around and on the right of the thin-film piezoelectric resonator 34. Thin-film piezoelectric resonators 35 to 37 are disposed around and on the left of the thin-film piezoelectric resonator 34.

Each of the thin-film piezoelectric resonators 31 to 37 (designated by the reference number "3" for general description of the thin-film piezoelectric resonators) uses resonance of longitudinal vibration in a direction of thickness of the piezoelectric material 5. Each of the cavities 21 to 27 (designated by the reference number "2H" for general description of the cavities and equivalent to acoustic reflection layers in embodiments which will be described later) disposed just under the lower electrode 4 to confine vibration of the piezoelectric material 5 needs to have a size not smaller than the length λ of vibration leaked from ends of the excitation portions 71 to 77 (designated by the reference number "7" for general description of the excitation portions) each having a lower electrode 4, an upper electrode 6 and a piezoelectric material 5 overlapping the lower and upper electrodes 4 and 6. That is, the average distance d from ends of the excitation portions 7 to the cavities 2H satisfies d >λ in the whole periphery (whole circumference of one excitation portion) of the excitation portions 7. Here, each excitation portion 7 is formed of all regions where the cavity 2H (or acoustic reflection layer), the lower electrode 4, the piezoelectric material 5 and the upper electrode 6 overlap one another.

Figure 3:
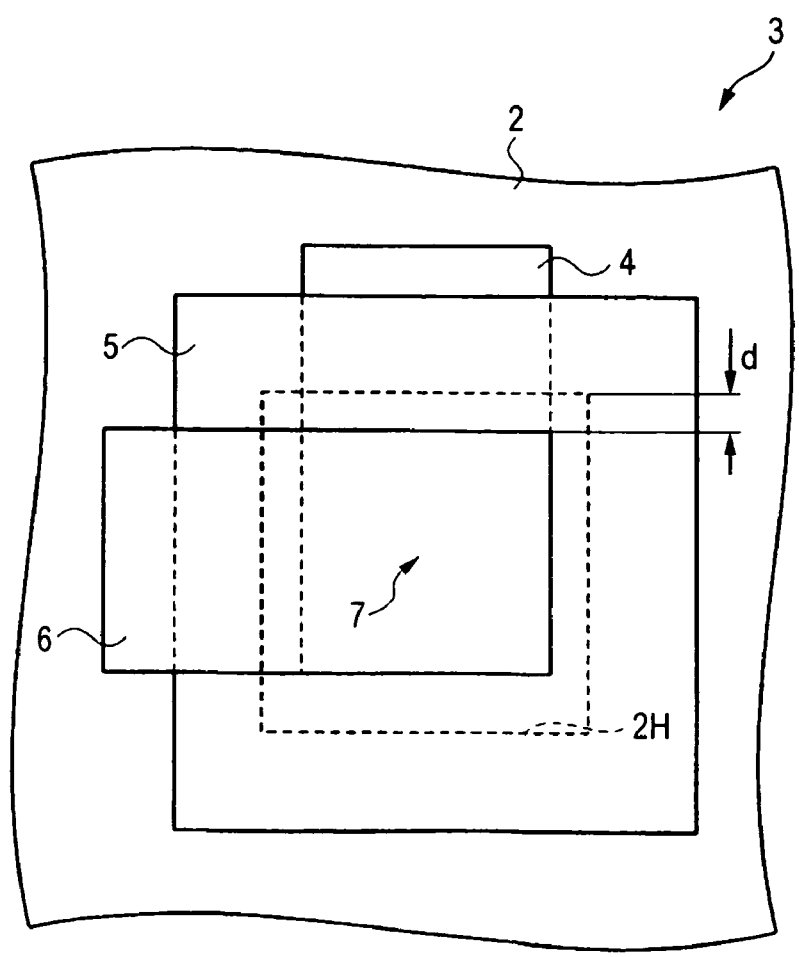
FIG. 3 is a plan view of important part for explaining the positional relation between a cavity and an excitation portion in one of the thin-film piezoelectric resonators depicted in FIG. 1.

FIG. 3 shows the planar positional relation between the cavity 2H and the excitation portion 7 in one thin-film piezoelectric resonator 3 in the case where the both are simply shaped like rectangles in plan view. Because the length λ is be estimated to be within a range of from 1 μm to 2 μm, the average distance d is set on the basis of a value calculated by adding an alignment tolerance on production to the length λ. Here, the term "alignment tolerance" means a tolerance for an alignment error of a producing device (an error in mask alignment on production) in an alignment position of the excitation portion 7 with respect to the alignment position of the cavity 2H. In a general filter formed of a combination of a plurality of resonators different in size, the distance between the opening end of the cavity and the end of the excitation portion is constant regardless of the size of each resonator. In this case, severe management in a producing process is required because the aforementioned problem occurs. Therefore, the cavities 2H (or acoustic reflection layers) in the filter 1 according to the first embodiment are produced by a robust design method in which the producing process is robust. The robust design method is as follows.

(1) First Design Method

The first design method is used on the assumption that a producing process for etching/removing a sacrificial layer embedded in each of the cavities 2H of the substrate 2 in advance is used. First, of the thin-film piezoelectric resonators 3 constituting the filter 1, the thin-film piezoelectric resonator 3 having the largest-capacity excitation portion (largest in planar size) is designed so that the opening size and opening shape of the cavity 2H satisfy the relation d (average distance)>λ (length). Then, another thin-film piezoelectric resonator 3 is designed so as to be provided with a cavity 2H having the same opening size and opening shape as those of the largest cavity 2H designed previously. Then, design of the opening size and opening shape of the cavity 2H is slightly adjusted in consideration of the arrangement position and wiring layout (patterns of lead-out wiring of the lower electrode 4 and lead-out wiring of the upper electrode 6) between the thin-film piezoelectric resonator 3 and the other thin-film piezoelectric resonator 3. Because the film strength of the excitation portion 7 is reduced at the time of production of the cavity 2H if the difference between the opening size of the cavity 2H and the planar size of the excitation portion 7 is too large, the design of the opening size and opening shape of the cavity 2H is adjusted within a range to keep the film strength on the basis of respective stress designs of the lower electrode 4, the piezoelectric material 5 and the upper electrode 6.

Figure 41:
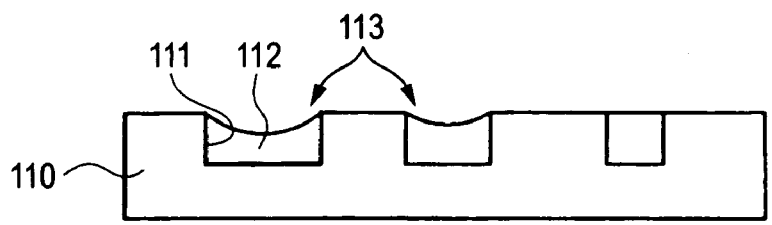
FIG. 41 is a sectional view of important part of thin-film piezoelectric resonators for explaining a problem in the background art.
Figure 42:
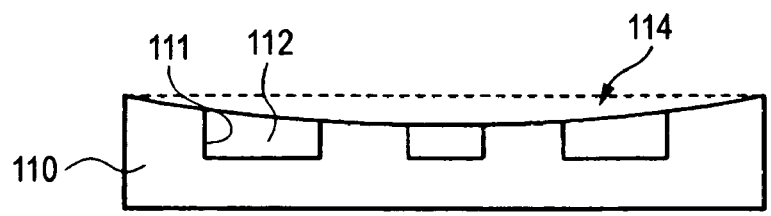
FIG. 42 is a sectional view of important part of thin-film piezoelectric resonators for explaining a problem in the background art.

In the filter 1 produced on the basis of this design method, the average distance d between the end of the excitation portion 7 of at least one thin-film piezoelectric resonator 3 and the opening end of the cavity 2H is different from the average distance d between the end of the excitation portion 7 of another thin-film piezoelectric resonator 3 and the opening end of the cavity 2H. Because the opening size or opening shape of the cavity 2H is narrowly distributed compared with the case where the distance from the end of the excitation portion to the opening end of the cavity is constant, dishing (the reference numeral 113 in FIG. 41) or erosion (the reference numeral 114 in FIG. 42) can be restrained from being caused in the substrate flattening process. The flatness of the substrate particularly affects the crystallinity and surface morphology of the lower electrode 4 and the piezoelectric material 5, so that the flat substrate makes it possible to form a good-crystallinity flat film of the piezoelectric material 5. The crystallinity and flatness of the piezoelectric material 5 are parameters important for production of a high-performance thin-film piezoelectric resonator 3 because the crystallinity and flatness have large correlation with the mechanical coupling coefficient and Q value, which indicate the performance of the thin-film piezoelectric resonator 3.

When the sacrificial layer embedded in the cavity 2H having a small opening size or the sacrificial layer narrowly distributed in the producing process is removed by etching, variation in etching time in accordance with the plurality of thin-film piezoelectric resonators 3 is reduced so that step management in the producing process can be made easily. Moreover, in the filter 1, for example, formed of a combination of seven or more thin-film piezoelectric resonators 3 in a layout in which one thin-film piezoelectric resonator 3 is surrounded by other thin-film piezoelectric resonators 3, the etching speed of the sacrificial layer embedded in the cavity 2H of the thin-film piezoelectric resonator 3 located in the center portion becomes lower than the etching speed of the sacrificial layer embedded in the cavity 2H of any other thin-film piezoelectric resonator 3 located in the peripheral portion, because the concentration of the etching solution becomes uneven locally. When the sacrificial layer of the thin-film piezoelectric resonator 3 located in the center portion is designed to be smaller than the sacrificial layers of the other thin-film piezoelectric resonators 3 located in the peripheral portion in consideration of this phenomenon, the etching end-point times of the sacrificial layers can be made uniform in the filter 1. In the filter 1 using such a design, dishing or erosion can be restrained from being caused by the substrate flattening step in the producing process.

(2) Second Design Method

The second design method is used on the assumption that a producing process for etching the substrate 2 from the rear surface to the front surface by a Deep-RIE method to form cavities 2H is used. First, of the thin-film piezoelectric resonators 3 constituting the filter 1, the thin-film piezoelectric resonator 3 having the largest-capacity excitation portion is designed so that the opening size and opening shape of the cavity 2H satisfy the relation d (average distance)>λ (length). Then, another thin-film piezoelectric resonator 3 is designed so as to be provided with a cavity 2H having the same opening size and opening shape as those of the largest cavity 2H designed previously. Then, design of the opening size and opening shape of the cavity 2H is slightly adjusted in consideration of the arrangement position and wiring layout between the thin-film piezoelectric resonator 3 and the other thin-film piezoelectric resonator 3. Because the film strength of the excitation portion 7 is reduced at the time of production of the cavity 2H if the difference between the opening size of the cavity 2H and the planar size of the excitation portion 7 is too large, the design of the opening size and opening shape of the cavity 2H is adjusted within a range to keep the film strength on the basis of respective stress designs of the lower electrode 4, the piezoelectric material 5 and the upper electrode 6.

Figure 43:
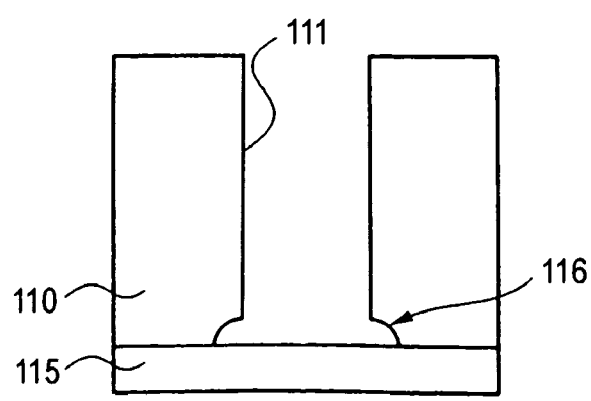
FIG. 43 is a sectional view of important part of thin-film piezoelectric resonators for explaining a problem in the background art.

In the filter 1 produced on the basis of this design method, the average distance d between the end of the excitation portion 7 of at least one thin-film piezoelectric resonator 3 and the opening end of the cavity 2H is different from the average distance d between the end of the excitation portion 7 of the other thin-film piezoelectric resonator 3 and the opening end of the cavity 2H. Because the opening size or opening shape of the cavity 2H is narrowly distributed compared with the case where the distance from the end of the excitation portion to the opening end of the cavity is constant, variation in etching speed of the substrate 2 in the Deep-RIE step can be suppressed so that over-etching time up to the formation of the cavities 2H of all the thin-film piezoelectric resonators 3 can be reduced. The reduction in over-etching time can suppress formation of notches (the reference numeral 116 in FIG. 43). As a result, the estimated margin of parasitic capacitance added to the thin-film piezoelectric resonators 3 can be reduced, so that the filtering characteristic of the filter 1 can be improved. In the filter 1, because the distance between adjacently disposed thin-film piezoelectric resonators 3 can be reduced by the suppression of formation of notches, the length of wiring can be shortened so that the resistance of wiring can be lowered.

Moreover, in the stopper removal step (for removing an etching stopper layer disposed between the substrate 2 and the lower electrode 4) performed after the Deep-RIE step, the inner wall surface of each cavity 2H can be formed as a flat surface without any notch. That is, because shading caused by each notch at the time of dry etching or shaping a blind lane caused by each notch at the time of wet etching can be eliminated in the cavity 2H so that the residue of the sacrificial layer can be eliminated, spurious response on resonance characteristic can be prevented so that the filtering characteristic can be improved.

In the process of production of the filter 1 formed of nine or more thin-film piezoelectric resonators 3 in total which are provided so that one thin-film piezoelectric resonator 3 is provided in the center portion, and eight thin-film piezoelectric resonators 3 are disposed at regular intervals of 45 degrees and in the peripheral portion, the etching speed of RIE for forming the cavity 2H of the thin-film piezoelectric resonator 3 disposed in the center portion becomes slower than the etching speed of RIE for forming the cavities 2H of the thin-film piezoelectric resonators 3 disposed in the peripheral portion by the loading effect. When the opening size of the cavity 2H of the thin-film piezoelectric resonator 3 disposed in the center portion is designed to be larger than the opening size of the cavity 2H of each of the thin-film piezoelectric resonators 3 disposed in the peripheral portion in consideration of this phenomenon, etching end-point times of the cavities 2H of all the thin-film piezoelectric resonators 3 can be made uniform in the filter 1 so that over-etching time of the substrate 2 can be shortened.

(3) Average Distance between Opening End of Cavity and End of Excitation Portion The average distance d between the opening end of the cavity 2H and the end of the excitation portion 7 will be described in each thin-film piezoelectric resonator 3. The same definition of the average distance d also applies to the average distance d between the contour of an acoustic reflection layer which will be described later and the end of the excitation portion 7.

Figure 4:
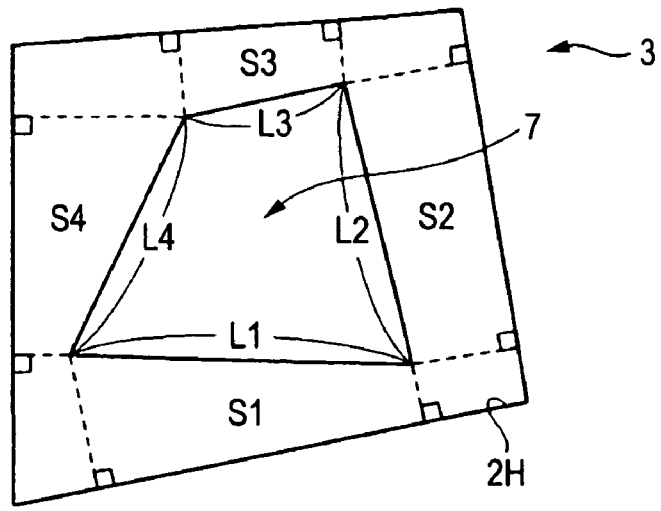
FIG. 4 is a typical plan view of important part for explaining an average distance in one of the thin-film piezoelectric resonators depicted in FIG. 1.

As shown in FIG. 4, when the opening shape of the cavity 2H is a quadrangle while the planar shape (planar contour shape) of the excitation portion 7 is a quadrangle not similar to the opening shape but smaller than the opening shape, the average distance d is equal to a value (d=S/L) obtained in such a manner that the sum S of areas S1, S2, S3 and S4 in regions each surrounded by an opening end of the cavity 2H, an end of the excitation portion 7 facing the opening end of the cavity 2H and two normal lines drawn from the opening end of the cavity 2H to the end of the excitation portion 7 so as to be alienated from each other by the maximum alienation distance regardless of the opening shape of the cavity 2H and the planar shape (contour shape) of the excitation portion 7 is divided by the circumferential length L which is the sum of lengths L1, L2, L3 and L4 of ends of the excitation portion 7.

Figure 5:
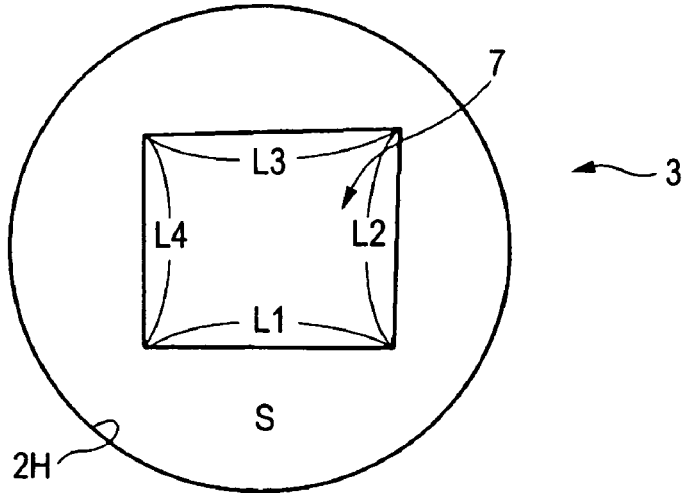
FIG. 5 is a typical plan view of important part for explaining an average distance in one of the thin-film piezoelectric resonators depicted in FIG. 1.

As shown in FIG. 5, when the opening shape of the cavity 2H is circular while the planar shape of the excitation portion 7 is so rectangular as to have a planar size contained in the cavity 2H, the average distance d is equal to a value (d=S/L) obtained in such a manner that the area S obtained by subtracting the planar area of the excitation portion 7 from the opening area of the cavity 2H is divided by the circumferential length L which is the sum of lengths L1, L2, L3 and L4 of ends of the excitation portion 7.

Figure 6:
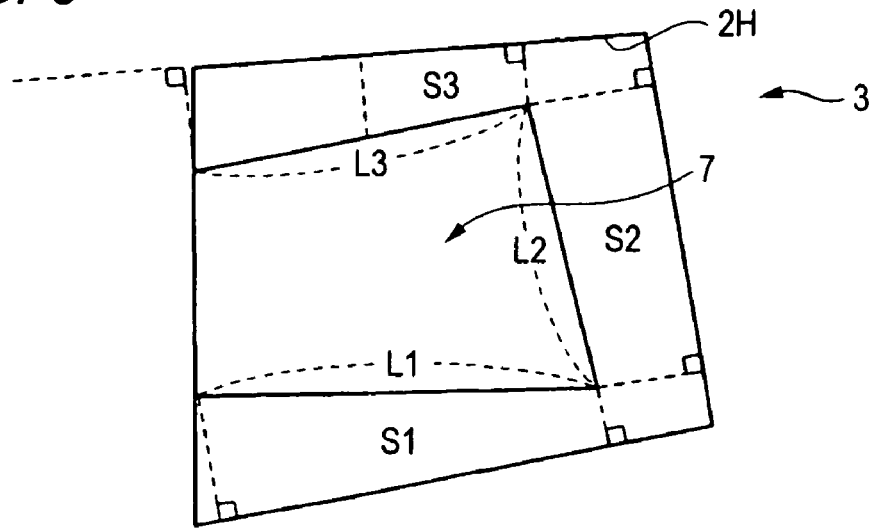
FIG. 6 is a typical plan view of important part for explaining an average distance in one of the thin-film piezoelectric resonators depicted in FIG. 1.

As shown in FIG. 6, when the opening shape of the cavity 2H is rectangular and the planar shape of the excitation portion 7 is rectangular (like the case shown in FIG. 4) while the opening shape of the cavity 2H and the planar shape of the excitation portion 7 have such a positional relation that a part (side) of the opening shape and a part (side) of an end of the excitation portion 7 overlap each other, the average distance d is equal to a value (d=S/L) obtained in such a manner that the sum S of areas S1, S2 and S3 in regions each surrounded by an opening end of the cavity 2H, an end of the excitation portion 7 facing the opening end of the cavity 2H and two normal lines drawn from the opening end of the cavity 2H to the end of the excitation portion 7 so as to be alienated from each other by the maximum alienation distance, except the overlapping portion, is divided by the circumferential length L which is the sum of lengths L1, L2, L3 and L4 of ends of the excitation portion 7.

FIRST EXAMPLE

A specific first example of the thin-film piezoelectric resonators 3 and the filter 1 formed of the thin-film piezoelectric resonators 3 will be described next.

(1) Evaluation concerned with Change of Notch Quantity relative to Opening Size of Cavity The cavities 2H of the thin-film piezoelectric resonators 3 constituting the filter 1 were produced in such a manner that the rear surface of the substrate 2 was etched toward the front surface by an ICP-RIE apparatus (Inductively Coupled Plasma-Reactive Ion Etching) using the Bosch process. In the Bosch process, $SF_6$ gas playing the role of etching the substrate 2, especially, silicon and $C_4F_8$ gas playing the role of generating a polymer protection film on a side wall of an etching hole are used as etching gas so that Si is etched perpendicularly and deeply while an etching process and a process of generating the protection film are performed alternately.

Figure 7:
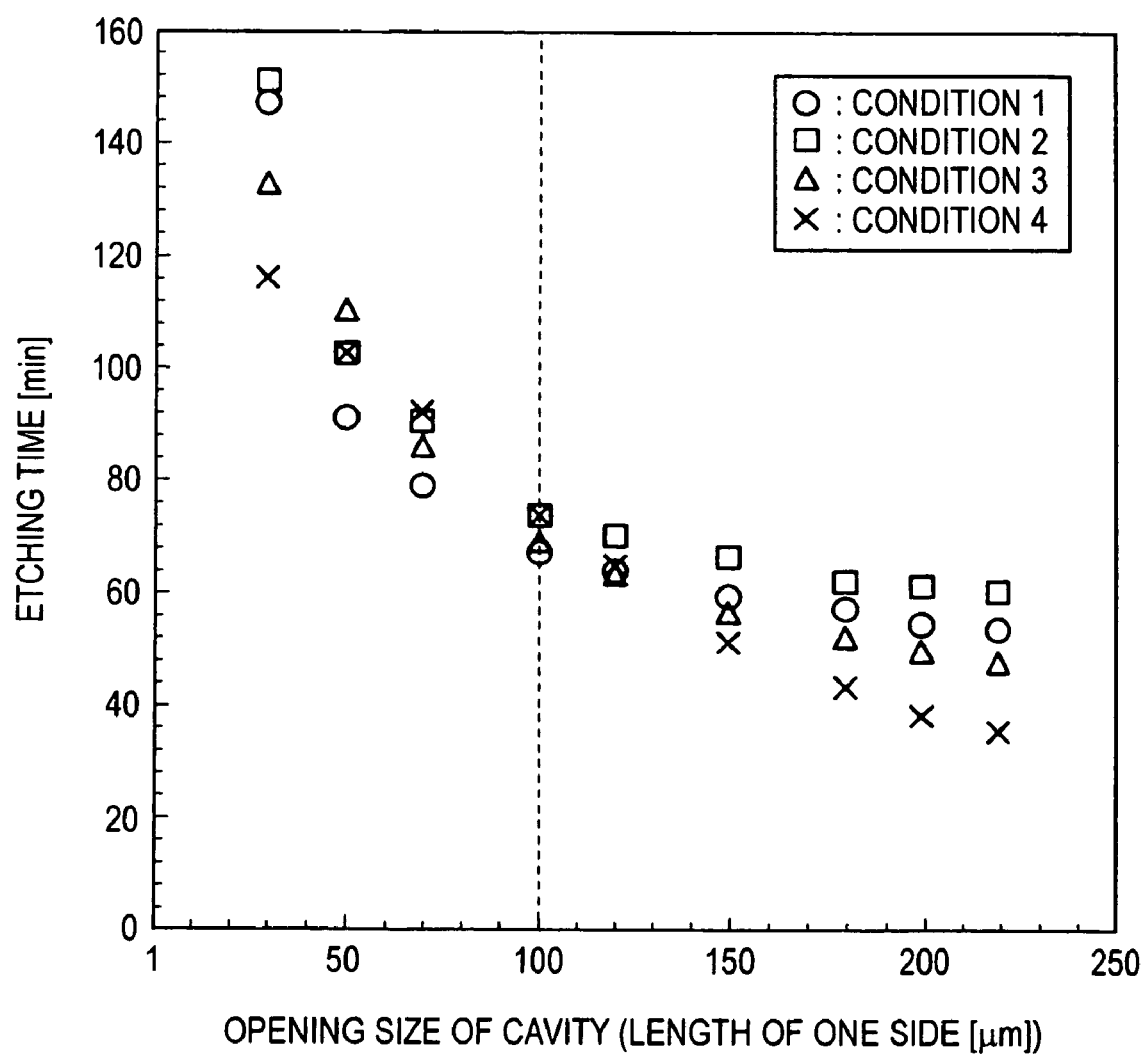
FIG. 7 is a graph showing the relation between the opening size of each cavity and the etching time in a first example of the first embodiment.

FIG. 7 shows the relation between the opening size of the cavity 2H and the etching time in production of the cavity 2H having a square opening shape. A 200 μm-thick Si substrate was used as the substrate 2. In FIG. 7, the horizontal axis expresses the opening size (length of one side: μm) of the cavity 2H, and the vertical axis expresses the etching time (minutes). A thermally oxidized Si ($SiO_2$) film was used as the etching stopper layer.

As shown in FIG. 7, etching times were measured in four etching conditions (condition 1 to condition 4) respectively. The etching time varied according to change in the opening size of the cavity 2H regardless of the etching condition. There was a tendency that the etching time shortened as the opening size increased. In addition, the etching time distribution became wide as the etching time became so short that the etching condition became advantageous on the producing process. For example, in the case of production of the filter 1 from a combination of thin-film piezoelectric resonators 3 in which the opening size of each cavity 2H is in a range of from 100 μm×100 μm to 200 μm×200 μm, the over-etching time of 4 minutes at the least and 30 minutes at the most is required. When, for example, a 6 inch-size wafer is used as the substrate 2, the etching state varies in a region of from the center of the wafer to each end portion of the wafer, so that an etching time difference corresponding to the variation in the etching state is required as an over-etching time margin. Although the over-etching time margin depends on the characteristic of the producing apparatus, the over-etching time margin is generally from about 1 minute 30 seconds to about 2 minutes. On the other hand, after etching started from the rear surface of the substrate 2 reaches the stopper layer on the front surface of the substrate 2, the notch growth speed is about 2 μm per minute. The thin-film piezoelectric resonators 3 and the filter 1 according to the first example are produced on the basis of such an evaluation result of Deep-RIE.

(2) Method for Production of Thin-Film Piezoelectric Resonator

A specific method for producing the thin-film piezoelectric resonators 3 and the filter 1 according to the first example will be described next.

First, a substrate 2 is prepared. For example, a Si substrate having a (100) crystal face with a high resistance value of 1 kΩ·cm or more is used as the substrate 2. A primer layer 201 is formed on a surface of the substrate 2 (see FIG. 8). A thermally oxidized Si film having a film thickness of 200 nm is used as the primer layer 201. The primer layer 201 is used as a primer of the lower electrode 4 and used as an etching stopper layer for forming the cavity 2H.

Figure 8:
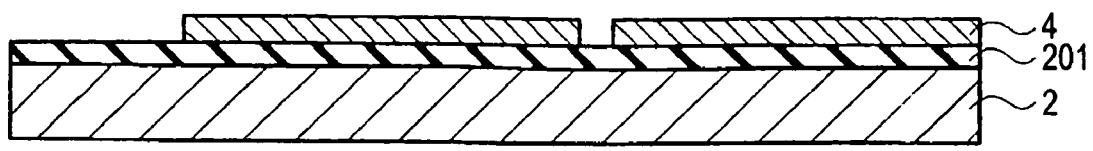
FIG. 8 is a first step sectional view for explaining a method for producing thin-film piezoelectric resonators and a filter according to the first example.

As shown in FIG. 8, the lower electrode 4 is formed on the primer layer 201 in regions where the thin-film piezoelectric resonators 3 will be formed. For example, an Al film or an Al alloy film having a film thickness of 200 nm to 250 nm is used as the lower electrode 4. After the lower electrode 4 is formed as a film on the whole region of the front surface of the substrate 2 by a sputtering method or the like, a mask is formed by lithography. While the mask is used, the lower electrode 4 is patterned by etching such as RIE.

Figure 9:
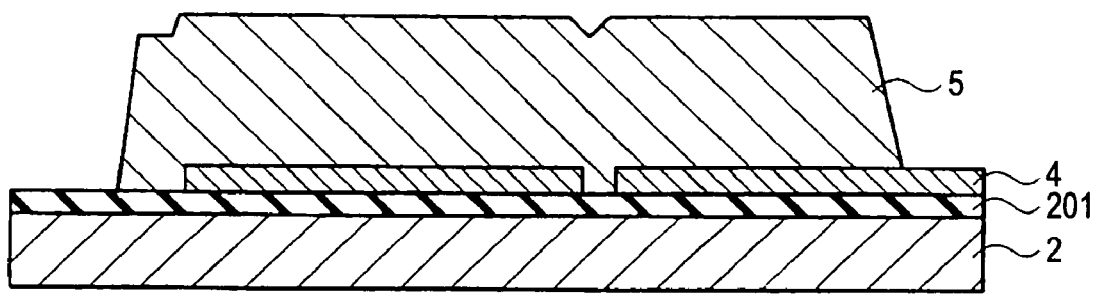
FIG. 9 is a second step sectional view.

As shown in FIG. 9, a piezoelectric material 5 is formed on the lower electrode 4 in the regions where the thin-film piezoelectric resonators 3 will be formed. For example, an AlN film having a film thickness of 1500 nm to 3000 nm is used as the piezoelectric material 5. After the piezoelectric material 5 is formed as a film on the whole region of the front surface of the substrate 2 by a sputtering method or the like, a mask is formed by lithography. While the mask is used, the piezoelectric material 5 is patterned by etching such as RIE. A ZnO having the same hexagonal-system crystalline structure as that of the AlN film may be used as the piezoelectric material 5 instead of the AlN film.

Figure 10:
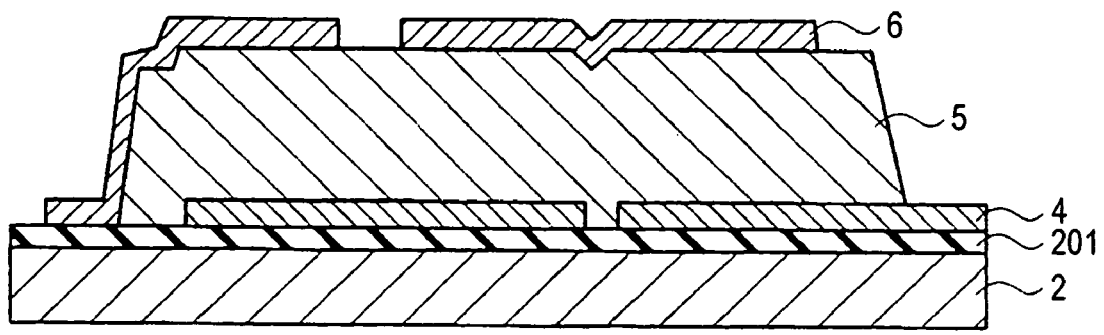
FIG. 10 is a third step sectional view.

As shown in FIG. 10, an upper electrode 6 is formed on the piezoelectric material 5 in the regions where the thin-film piezoelectric resonators 3 will be formed. For example, an Al film, an Al alloy film or an Mo film having a film thickness of 200 nm to 300 nm is used as the upper electrode 6. After the upper electrode 6 is formed as a film on the whole region of the front surface of the substrate 2 by a sputtering method or the like, a mask is formed by lithography. While the mask is used, the upper electrode 6 is patterned by etching such as RIE.

Figure 11:
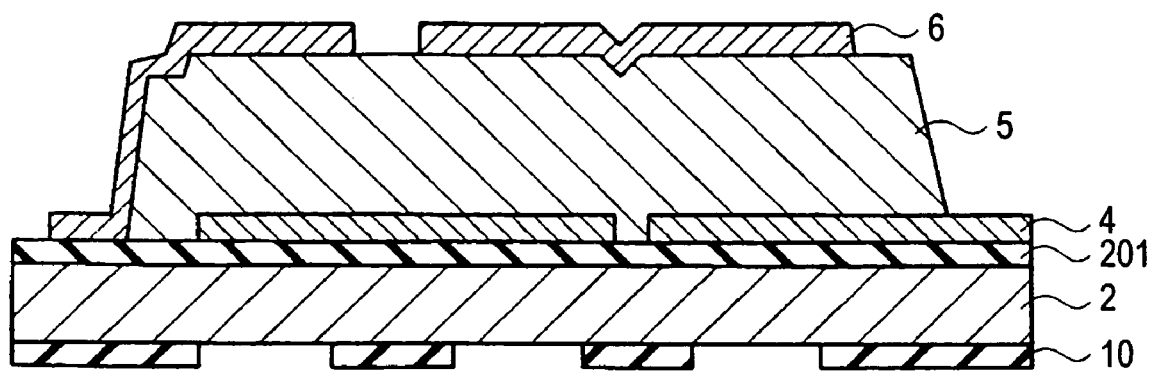
FIG. 11 is a fourth step sectional view.

When the filter 1 is a parallel type filter, a mass load layer not shown but provided for shifting a resonance frequency is then formed on the upper electrode 6. As shown in FIG. 11, a mask 10 in which regions where cavities 2H will be formed are opened is then formed on the rear surface of the substrate 2. For example, the mask 10 is formed by lithography.

Figure 12:
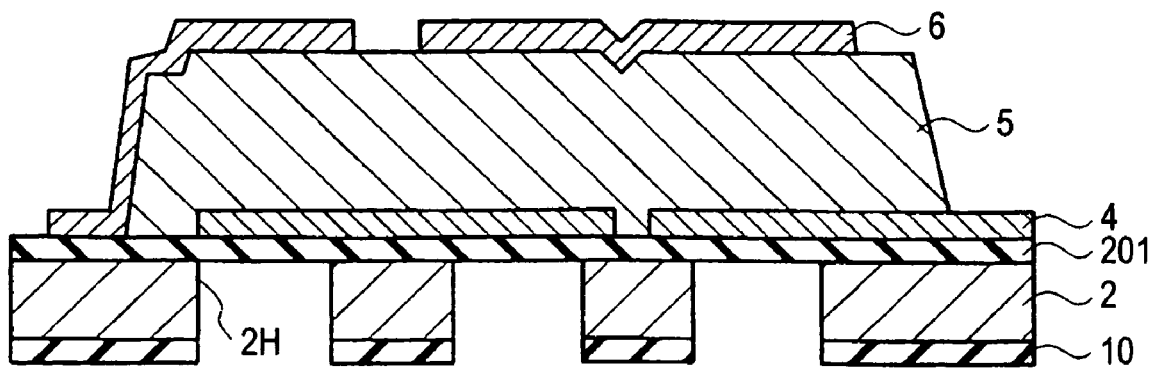

As shown in FIG. 12, while the mask 10 is used, Deep-RIE is performed of the rear surface toward the front surface of the substrate 2 to thereby form cavities 2H in the regions of the substrate 2 where the thin-film piezoelectric resonators 3 will be formed. For formation of the cavities 2H, the primer layer 201 serves as an etching stopper layer.

The exposed portions of the primer layer 201 in the cavities 2H are removed, for example, by wet etching and the mask 10 is then removed. Thus, the thin-film piezoelectric resonators 3 according to the first embodiment shown in FIG. 2 and the filter 1 formed of the thin-film piezoelectric resonators 3 can be produced.

(3) Specific Structure of Filter and Thin-Film Piezoelectric Resonator

Figures 13, 14:
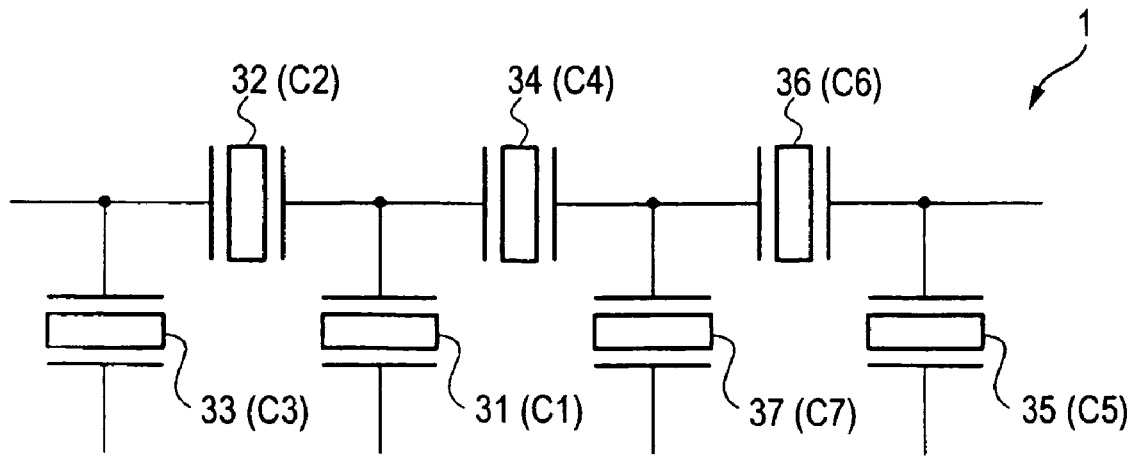
FIG. 13 is a circuit diagram of the filter according to the first example.
FIG. 14 is a table showing capacitance ratios of respective thin-film piezoelectric resonators in the filter according to the first example.

As shown in FIG. 13, the filter 1 according to the first example uses a structure in which thin-film piezoelectric resonators 32, 34 and 36 are electrically connected in series and thin-film piezoelectric resonators 31, 33, 35 and 37 are electrically connected in parallel. That is, the filter 1 is formed of seven thin-film piezoelectric resonators 31 to 37 in total (see FIG. 1). The capacitance ratios of the thin-film piezoelectric resonators 31 to 37 constituting the filter 1 are allocated as shown in FIG. 14.

The opening sizes of all cavities 21 to 27 in the thin-film piezoelectric resonators 31 to 37 are the same regardless of the sizes (capacitance values) of excitation portions 71 to 77. The planar shape of the excitation portion 71 is set to be a square 165 µm on a side, and the average distance d1 from ends of the excitation portion 71 to the opening end of the cavity 21 is set to be 10 µm. In this manner, the opening size of the cavity 21 in the thin-film piezoelectric resonator 31 is decided. The opening size of each of the cavities 22 to 27 in the other thin-film piezoelectric resonators 32 to 37 is set to be equal to the opening size of the cavity 21 in the thin-film piezoelectric resonator 31. That is, as for the average distance d in the filter 1, the average distance d2 is provided in the thin-film piezoelectric resonators 31 and 37 equal in capacitance ratio, and the average distance d1 different from the average distance d2 is provided in the thin-film piezoelectric resonators 32 to 36 (the average distance d has a plurality of values). Specifically, the average distance d has a distribution in a range of from 10 µm to 35 µm.

The lower electrode 4 is disposed (on the whole region on the cavity 2H) so that the cavity 2H of the thin-film piezoelectric resonator 3 is entirely covered with the lower electrode 4. On the front surface of the substrate 2, the lower electrode 4 and the upper electrode 6 are disposed opposite to each other, so that parasitic capacitance is generated between the lower electrode 4 and the upper electrode 6. A layout in which the lower electrode 4 has no step on the cavity 2H is formed so that the lower electrode 4 is supported to the front surface of the substrate 2 along the whole region of the circumferential edge of the opening end of the cavity 2H. That is, the lower electrode 4 (excitation portion 7) is suspended on the cavity 2H but the mechanical strength of the film of the lower electrode 4 is so high that the lower electrode 4 is strong to breaking.

In the filter 1 designed as described above, the cavity 2H is produced by Deep-RIE from the rear surface toward the front surface of the substrate 2. When the thickness of the substrate 2 to be etched is 200 µm and etching is performed based on the "condition 4" shown in FIG. 7, the etching time is about 43 minutes as shown in FIG. 15. When a 6-inch wafer is used as the substrate 2, an over-etching time of 1 minute 30 seconds is added to the etching time in order to ensure the uniformity of etching amount in a surface of the wafer. The amount of the notch generated at the time of over-etching is about 3 µm at the most. For example, if the alignment tolerance (alignment displacement) of the alignment apparatus is 5 µm at the most, the planar size of the lower electrode 4 is set to be larger by at least 8 µm than the opening size of the cavity 2H. Even in the case where the cavity 2H is designed to be larger than the required minimum size, the amount of the notch can be suppressed. Accordingly, the distance between adjacent cavities 2H can be narrowed so that reduction in size of the filter 1 can be achieved. Change in parasitic capacitance due to the notch is about 2.5% at the most for one thin-film piezoelectric resonator 3. Generation of spurious response is suppressed.

FIRST COMPARATIVE EXAMPLE

Figure 16:
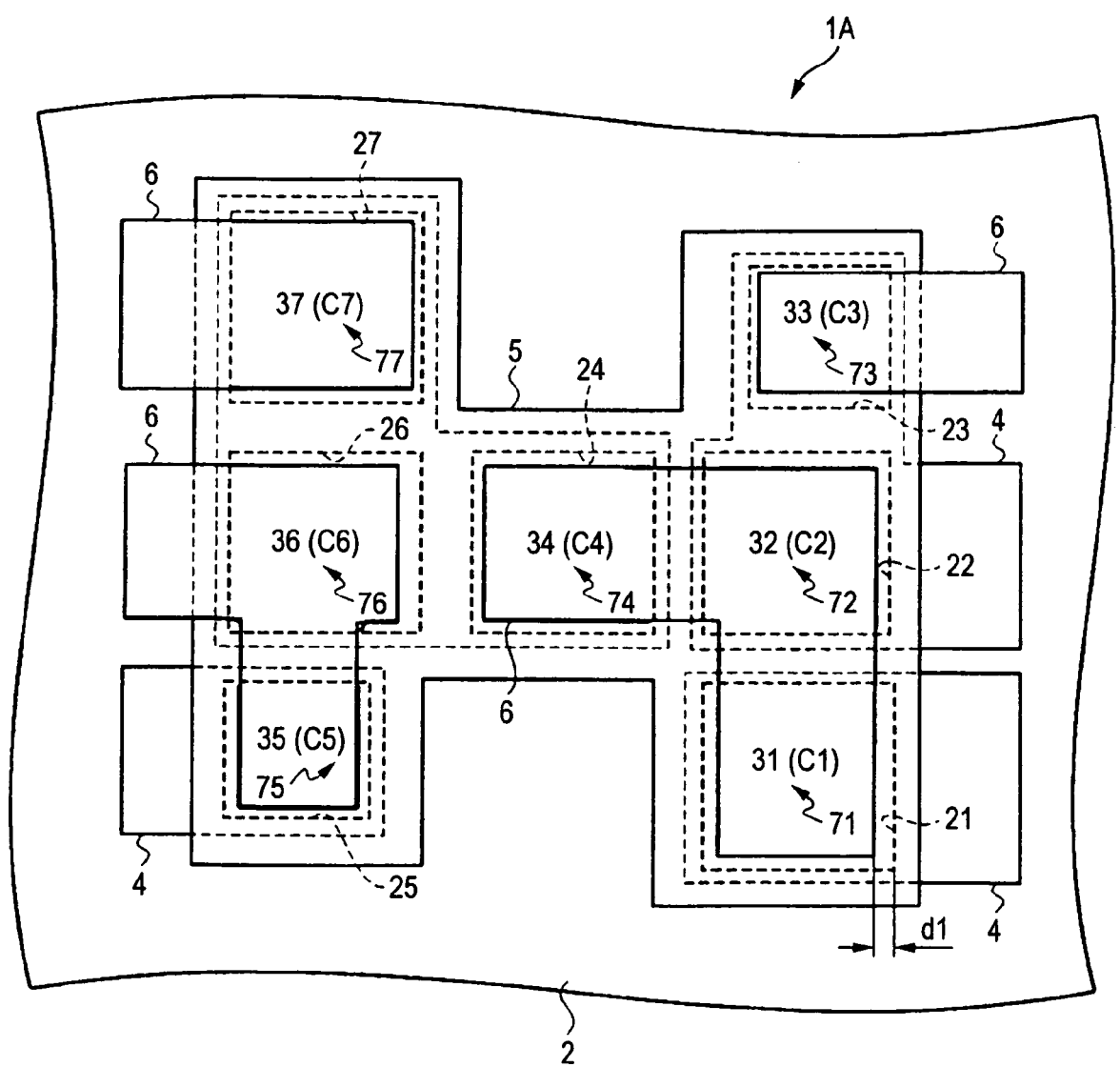
FIG. 16 is a plan view of thin-film piezoelectric resonators and a filter according to a first comparative example of the first embodiment.

FIG. 16 shows a first comparative example. In thin-film piezoelectric resonators 3 of a filter 1A according to the first comparative example, average distances d from ends of excitation portions 7 to opening ends of cavities 2H are equal in all the thin-film piezoelectric resonators 31 to 37. That is, the average distance d is set to be equal to d1, for example, 10 µm. Accordingly, each cavity 2H has a square opening shape having an opening size in which each side is in a range of from 135 µm to 185 µm.

In the filter 1A designed as described above, each cavity 2H is produced by Deep-RIE from the rear surface toward the front surface of the substrate 2. When the thickness of the substrate 2 to be etched is 200 µm and etching is performed based on the "condition 2" in which the area distribution is small as shown in FIG. 7, the time required for etching the cavities 23 and 25 smallest in opening size is about 68 minutes as shown in FIG. 15. On the assumption that a 6-inch wafer is used, an over-etching time of 1 minute 30 seconds is added to the etching time. In this case, over-etching is performed for about 8 minutes in the cavities 21 and 27 largest in opening size, so that the amount of the notch reaches 16 µm at the most. For example, if the alignment tolerance of the alignment apparatus is 5 µm at the most, the planar size of the lower electrode 4 must be set to be larger by at least 21 µm than the opening size of the cavity 2H. Because the amount of the notch increases, inner walls of adjacent cavities 2H need to be separated in order to ensure the mechanical strength of the substrate 2, so that it is difficult to achieve reduction in size of the filter 1A. Change in parasitic capacitance due to the notch reaches about 10% at the most for one thin-film piezoelectric resonator 3. Moreover, spurious response is generated in resonance characteristic because of disorder of the shape of the opening end of the cavity 2H, so that deterioration of filtering characteristic is observed. In addition, lowering of film strength against breaking of the excitation portion 7 is observed.

SECOND EXAMPLE

Figure 17:
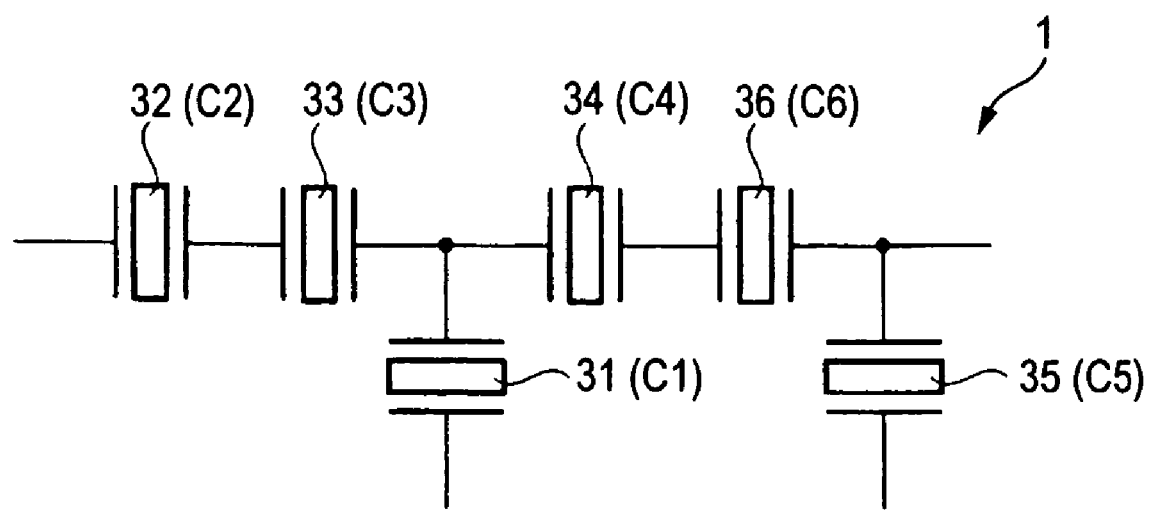
FIG. 17 is a circuit diagram of the filter according to a second example of the first embodiment.
Figure 18:
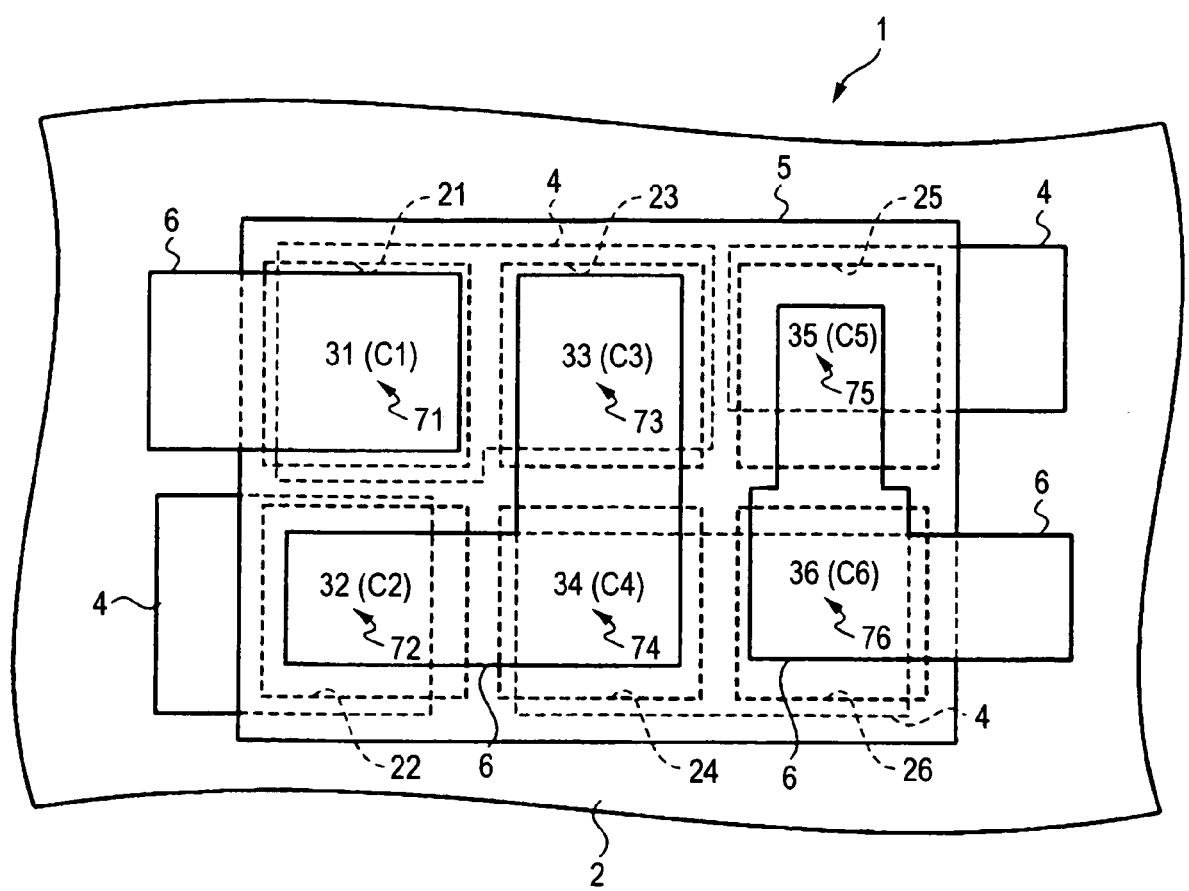
FIG. 18 is a plan view of thin-film piezoelectric resonators and a filter according to the second example.

As shown in FIGS. 17 and 18, a filter 1 according to a second example of the first embodiment is formed of six thin-film piezoelectric resonators 31 to 36 in total, using a structure in which thin-film piezoelectric resonators 32, 33, 34 and 36 are electrically connected in series while thin-film piezoelectric resonators 31 and 35 are electrically connected in parallel. The respective capacitance ratios of the thin-film piezoelectric resonators 31 to 36 constituting the filter 1 are allocated as shown in FIG. 19.

In the respective thin-film piezoelectric resonators 31 to 36, the opening sizes of all cavities 21 to 26 are equal regardless of the sizes (capacitance values) of excitation portions 71 to 76. The planar shape of the excitation portion 71 is set to be a square 165 μm on a side, and the average distance d1 from ends of the excitation portion 71 to the opening end of the cavity 21 is set to be 10 μm. In this manner, the opening size of the cavity 21 in the thin-film piezoelectric resonator 31 is decided. The opening size of each of the cavities 22 to 26 in the other thin-film piezoelectric resonators 32 to 36 is set to be equal to the opening size of the cavity 21 in the thin-film piezoelectric resonator 31. That is, as for the average distance d in the filter 1, the average distance d1 is provided in the thin-film piezoelectric resonator 31, and the average distance d2 different from the average distance d1 is provided in the thin-film piezoelectric resonators 32 to 36 (the average distance d has a plurality of values). Specifically, the average distance d has a distribution in a range of from 10 μm to 44 μm.

In each of the thin-film piezoelectric resonators 31 to 36, the cavity 2H-covering area of the lower electrode 4 is reduced so that overlapping of the lower electrode 4 and the upper electrode 6 can be avoided as sufficiently as possible to reduce generation of parasitic capacitance. As a result, in resonance characteristic, the influence of spurious response caused by the processed shape of the ends of the cavity 2H can be reduced. In the thin-film piezoelectric resonator 3 designed as described above, a part of the end of the lower electrode 4 is present in the opening of the cavity 2H so that the support region of the lower electrode 4 in the surface of the substrate 2 is reduced to thereby lower the mechanical strength of the film of the lower electrode 4 (excitation portion 7). If the sectional shape of the end of the lower electrode 4 is processed into a taper shape with a sufficiently low angle, stress of the piezoelectric material 5 on the lower electrode 4 can be reduced so that the mechanical strength of the excitation portion 7 as a whole can be kept sufficient. For example, the sectional shape of the end of the lower electrode 4 is processed into such a taper shape that the angle between the bottom surface and the end surface on the substrate 2 side of the lower electrode 4 is set to be acute, for example, about 20 degrees.

In the filter 1 designed as described above, the cavity 2H is produced by Deep-RIE from the rear surface toward the front surface of the substrate 2. When the thickness of the substrate 2 to be etched is 200 μm and etching is performed based on the "condition 4" shown in FIG. 7, the etching time is about 43 minutes as shown in FIG. 15. On the assumption that a 6-inch wafer is used, an over-etching time of 1 minute 30 seconds is added to the etching time. The amount of the notch generated at the time of over-etching is about 3 μm at the most. For example, if the alignment tolerance of the alignment apparatus is 5 μm at the most, the planar size of the lower electrode 4 bridging the cavity 2H must be set to be larger by at least 8 μm than the opening size of the cavity 2H. Even in the case where the cavity 2H is designed to be not lower than the required minimum size, the amount of the notch can be suppressed. Accordingly, the distance between adjacent cavities 2H can be narrowed so that reduction in size of the filter 1 can be achieved. Change in parasitic capacitance due to the notch is about 0% for one thin-film piezoelectric resonator 3. Generation of spurious response is suppressed.

SECOND COMPARATIVE EXAMPLE

Figure 20:
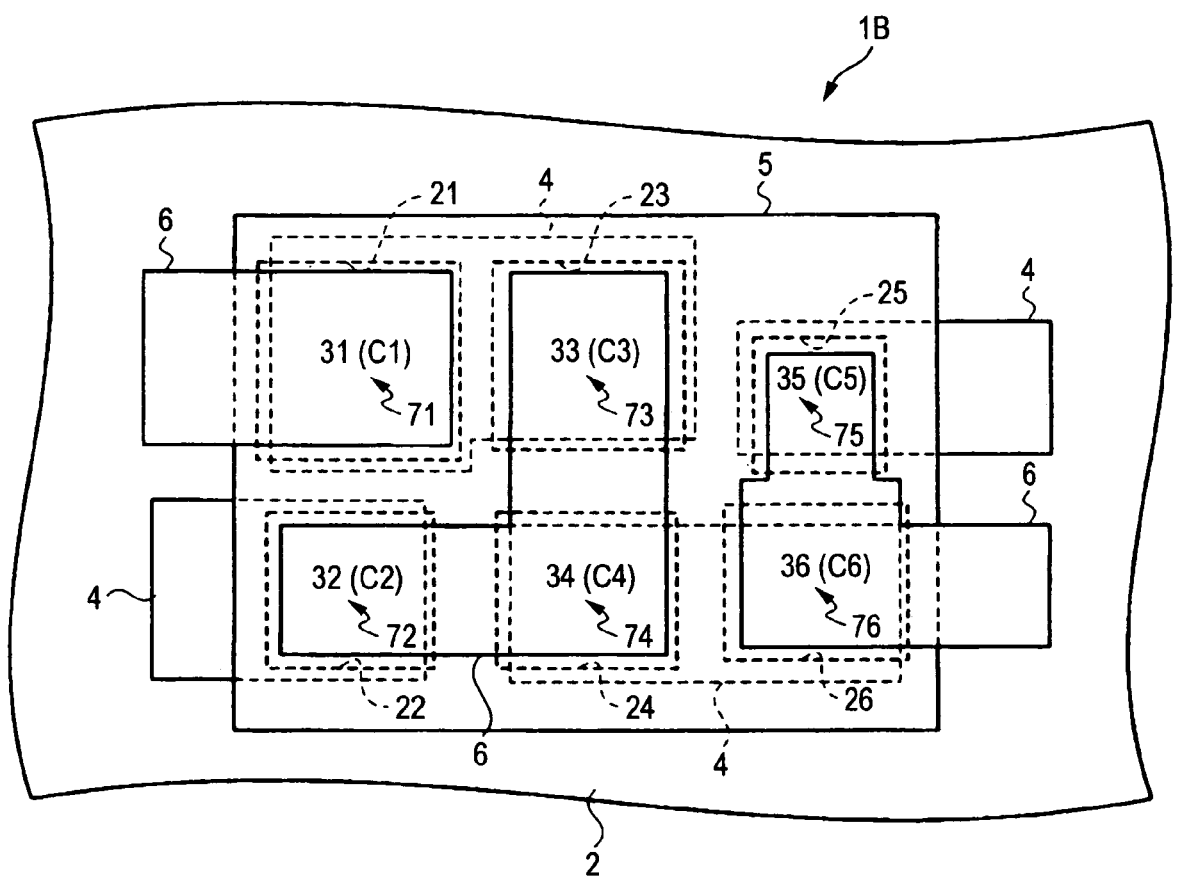
FIG. 20 is a plan view of thin-film piezoelectric resonators and a filter according to a second comparative example of the first embodiment.

FIG. 20 shows a second comparative example. In thin-film piezoelectric resonators 3 of a filter 1B according to the second comparative example, average distances d from ends of excitation portions 7 to opening ends of cavities 2H are equal in all the thin-film piezoelectric resonators 31 to 36. That is, the average distance d is set to be equal to d1, for example, 10 μm. Accordingly, each cavity 2H has a square opening shape having an opening size in which each side is in a range of from 116 μm to 185 μm.

In the filter 1B designed as described above, each cavity 2H is produced by Deep-RIE from the rear surface toward the front surface of the substrate 2. When the thickness of the substrate 2 to be etched is 200 μm and etching is performed based on the "condition 2" in which the area distribution is small as shown in FIG. 7, the time required for etching the cavity 25 smallest in opening size is about 72 minutes as shown in FIG. 15. On the assumption that a 6-inch wafer is used, an over-etching time of 1 minute 30 seconds is added to the etching time. In this case, over-etching is performed for about 10 minutes in the cavity 21 largest in opening size, so that the amount of the notch reaches 23 μm at the most. For example, if the alignment tolerance of the alignment apparatus is 5 μm at the most, the planar size of the lower electrode 4 must be set to be larger by at least 28 μm than the opening size of the cavity 2H. Because the amount of the notch increases, inner walls of adjacent cavities 2H need to be separated in order to ensure the mechanical strength of the substrate 2, so that it is difficult to achieve reduction in size of the filter 1B. There is no change in parasitic capacitance due to the notch. Moreover, generation of spurious response caused by disorder of the shape of the opening end of the cavity 2H is not observed in the resonance characteristic. However, lowering of film strength against breaking of the excitation portion 7 due to increase in the amount of the notch is observed.

THIRD EXAMPLE

Figure 21:
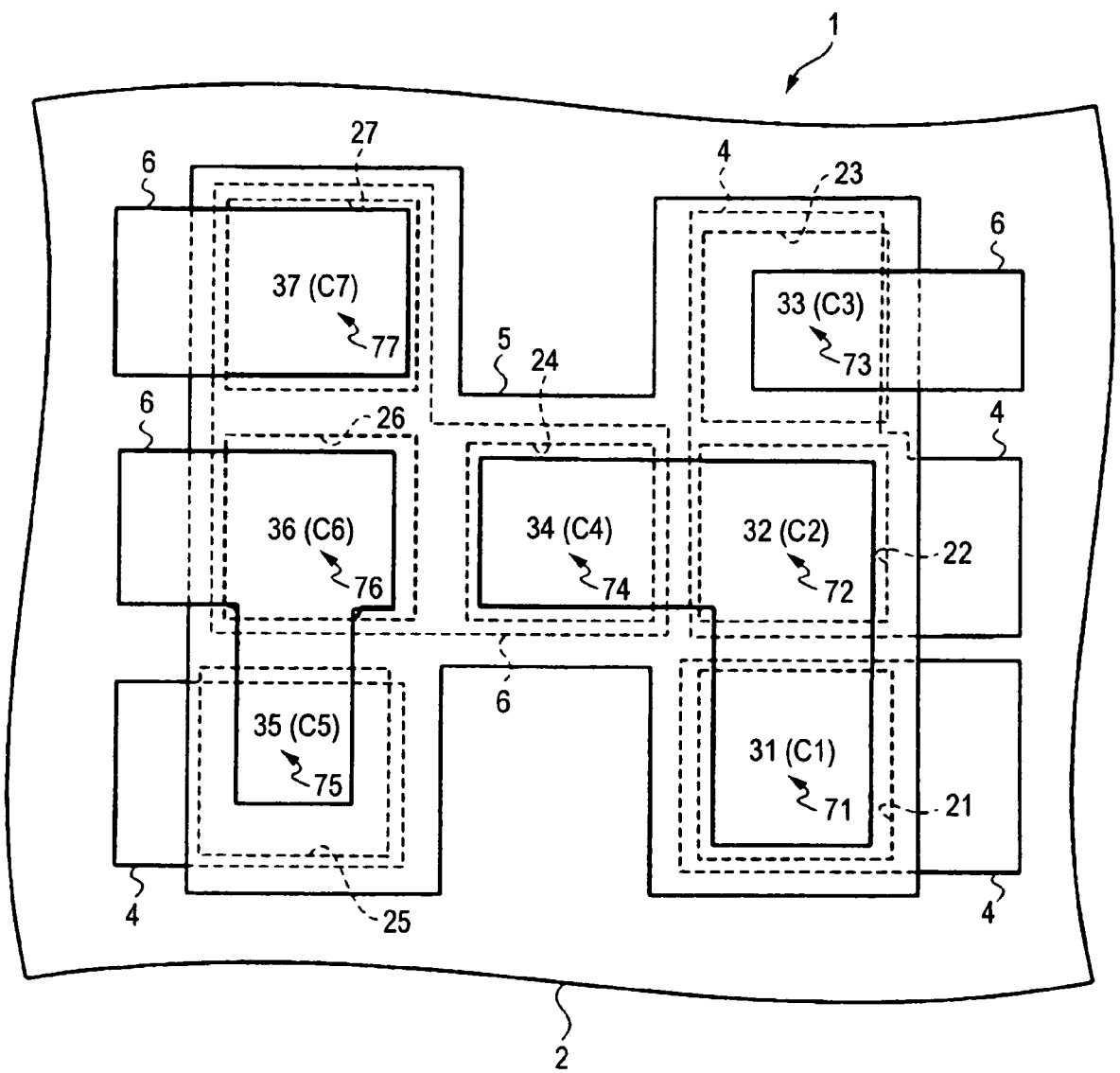
FIG. 21 is a plan view of thin-film piezoelectric resonators and a filter according to a third example of the first embodiment.

A filter 1 according to a third example of the first embodiment is basically the same as the filter 1 shown in FIGS. 1 and 13, except the following point. As shown in FIG. 21, a part of the end of the lower electrode 4 of a thin-film piezoelectric resonator 33 having an excitation portion 73 small in capacitance value (small in planar size) is disposed in the opening of the cavity 23. Similarly, a part of the end of the lower electrode 4 of a thin-film piezoelectric resonator 35 having an excitation portion 75 small in capacitance value is disposed in the opening of the cavity 25. In each of other thin-film piezoelectric resonators 31, 32, 34, 36 and 37, the lower electrode 4 is disposed to cover the whole region of the opening of the cavity 2H. The respective capacitance ratios of the thin-film piezoelectric resonators 31 to 37 are allocated as shown in FIG. 14.

In each of the thin-film piezoelectric resonators 33 and 35 small in capacitance value, the average distance d between the end of the excitation portion 7 and the opening end of the cavity 2H becomes large. Accordingly, the mechanical strength of the lower electrode 4 against breaking due to film stress of the piezoelectric material 5 is so high that mechanical film strength of the lower electrode 4 can be kept sufficient even when the end of the lower electrode 4 is present in the opening of the cavity 2H.

In the filter 1 designed as described above, the percentage of change in parasitic capacitance due to change in the amount of the notch can be reduced. Moreover, in parallel type thin-film piezoelectric resonators 3, resonance characteristic can be prevented from being affected by spurious response. Accordingly, skirt characteristic of the filter 1 can be made precipitous. In the filter 1, each cavity 2H is produced by Deep-RIE from the rear surface toward the front surface of the substrate 2 in the same manner as in the first example. Change in parasitic capacitance due to the notch is however about 1.8% at the most for one thin-film piezoelectric resonator 3.

THIRD COMPARATIVE EXAMPLE

Figure 22:
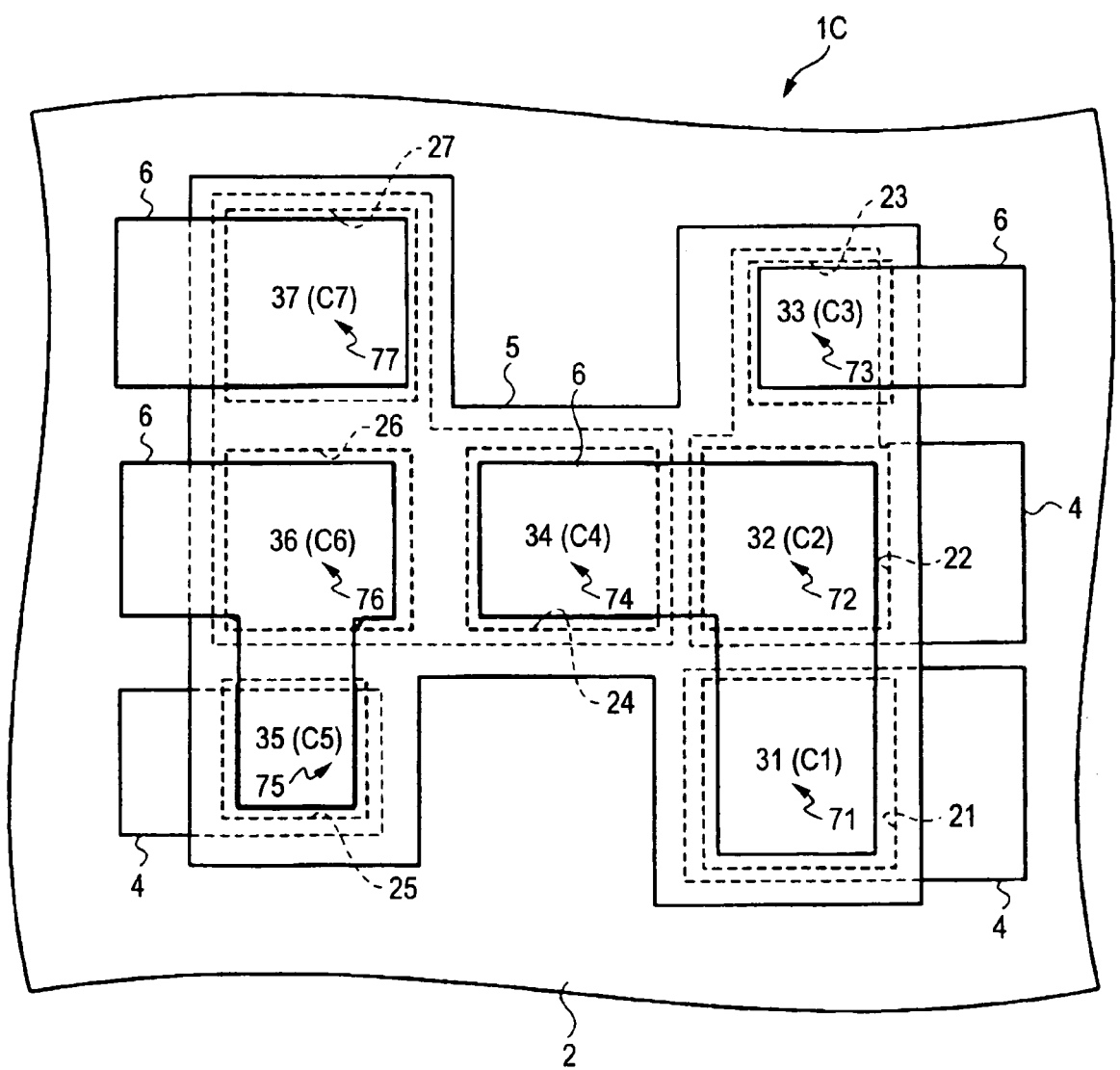
FIG. 22 is a plan view of thin-film piezoelectric resonators and a filter according to a third comparative example of the first embodiment.

FIG. 22 shows a third comparative example. In thin-film piezoelectric resonators 3 of a filter 1C according to the third comparative example, average distances d from ends of excitation portions 7 to opening ends of cavities 2H are equal in all the thin-film piezoelectric resonators 31 to 37. That is, the average distance d is set to be equal to d1, for example, 10 μm. Accordingly, each cavity 2H has a square opening shape having an opening size in which each side is in a range of from 135 μm to 185 μm.

In the filter 1C designed as described above, each cavity 2H is produced by Deep-RIE from the rear surface toward the front surface of the substrate 2. When the thickness of the substrate 2 to be etched is 200 μm and etching is performed based on the "condition 2" in which the area distribution is small as shown in FIG. 7, the time required for etching the cavity 25 smallest in opening size is about 65 minutes as shown in FIG. 15. On the assumption that a 6-inch wafer is used, an over-etching time of 1 minute 30 seconds is added to the etching time. In this case, over-etching is performed for about 10 minutes in the cavities 21 and 27 largest in opening size, so that the amount of the notch reaches 16 μm at the most. For example, if the alignment tolerance of the alignment apparatus is 5 μm at the most, the planar size of the lower electrode 4 must be set to be larger by at least 21 μm than the opening size of the cavity 2H. Because the amount of the notch increases, inner walls of adjacent cavities 2H need to be separated in order to ensure the mechanical strength of the substrate 2, so that it is difficult to achieve reduction in size of the filter 1C. Change in parasitic capacitance due to the notch reaches about 10% at the most for one thin-film piezoelectric resonator 3. Moreover, spurious response caused by disorder of the shape of the opening end of the cavity 2H is generated in resonance characteristic, so that deterioration of filtering characteristic is observed. In addition, lowering of film strength against breaking of the excitation portion 7 is observed.

Effect of the First Embodiment

When design is performed on the basis of the measurement results of the first to third examples and first to third comparative examples shown in FIG. 15 so that the average distance d from the excitation portion 7 of each thin-film piezoelectric resonator 3 to the opening end of the cavity 2H is not kept constant so that the opening size distribution of the cavity 2H is suppressed, shortening of the etching time, suppression of the amount of the notch, reduction in parasitic capacitance margin, etc. can be achieved. Thus, a filter 1 excellent in mass production and having stable filtering characteristic can be produced.

Moreover, also in the case where the presence/absence of parasitic capacitance is designed based on the positional relation between the lower electrode 4 and the cavity 2H in each thin-film piezoelectric resonator 3, the opening of the cavity 2H can be designed to improve the filtering characteristic of the filter 1 regardless of the planar size of the excitation portion 7.

Second Embodiment

A second embodiment of the invention will be described as an example in which thin-film piezoelectric resonators 3 and a filter 1 are produced on the basis of evaluation results in which change in etching speed relative to the density of arrangement of the cavity 2H is evaluated in thin-film piezoelectric resonators 3 and a filter 1 according to the first embodiment in which each cavity 2H is produced from the rear surface toward the front surface of the substrate 2.

(1) Change in Etching Speed Relative to the Density of Arrangement of Cavity

Figure 23:
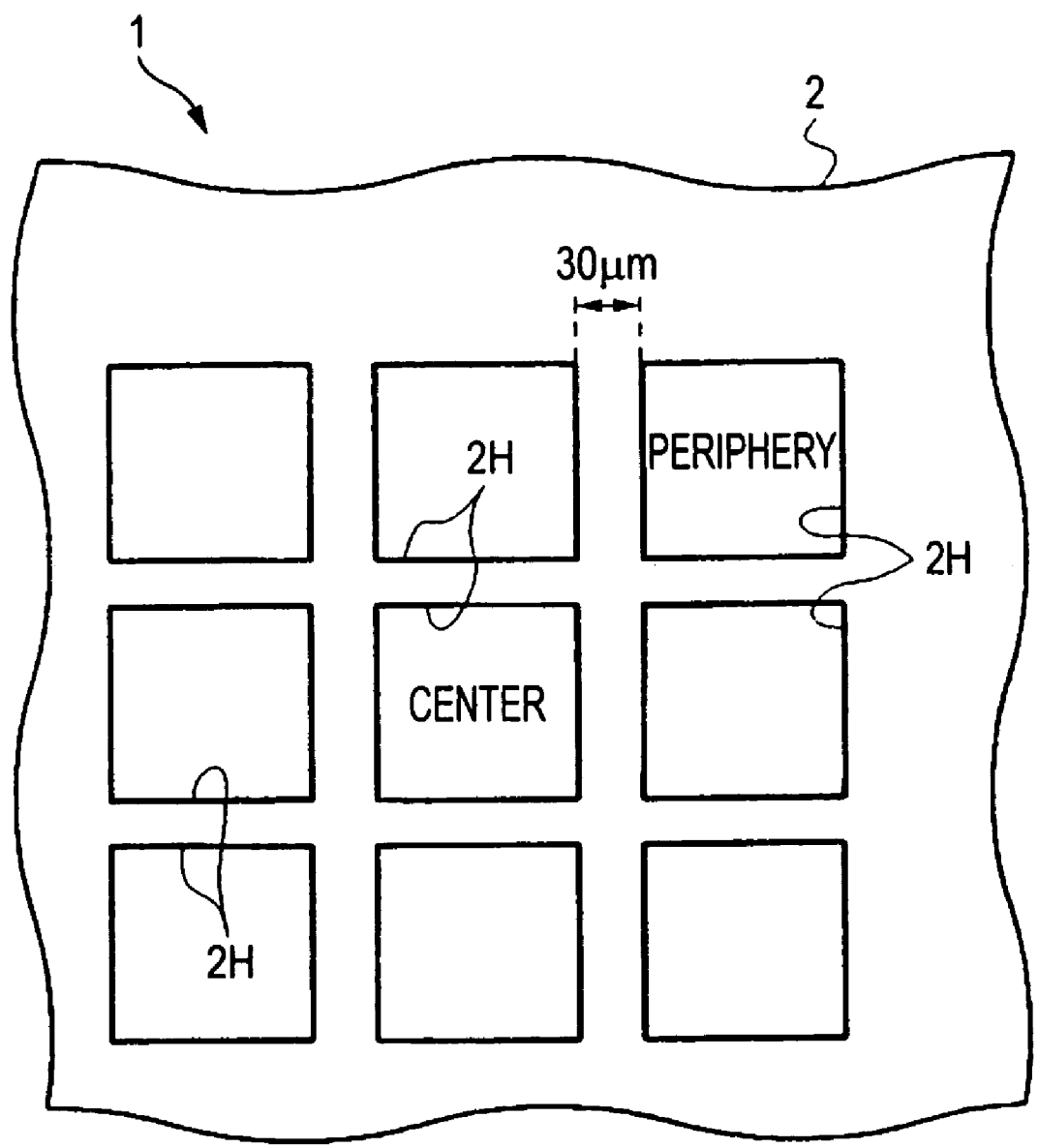
FIG. 23 is a plan view showing a layout of arrangement of cavities of thin-film piezoelectric resonators in a filter according to a second embodiment of the invention.

Though will be described in detail later, the filter 1 according to the second embodiment is formed of nine thin-film piezoelectric resonators 3 in total, arranged regularly. As shown in FIG. 23, in the thin-film piezoelectric resonators 3, nine cavities 2H in total are arranged on three rows and three columns in the substrate 2. Each cavity 2H has the same opening shape and is produced into a square shape. In other words, the substrate 2 has one cavity 2H disposed in its center portion, and eight cavities 2H disposed around the center cavity 2H and at regular intervals of 45 degrees.

Figure 24:
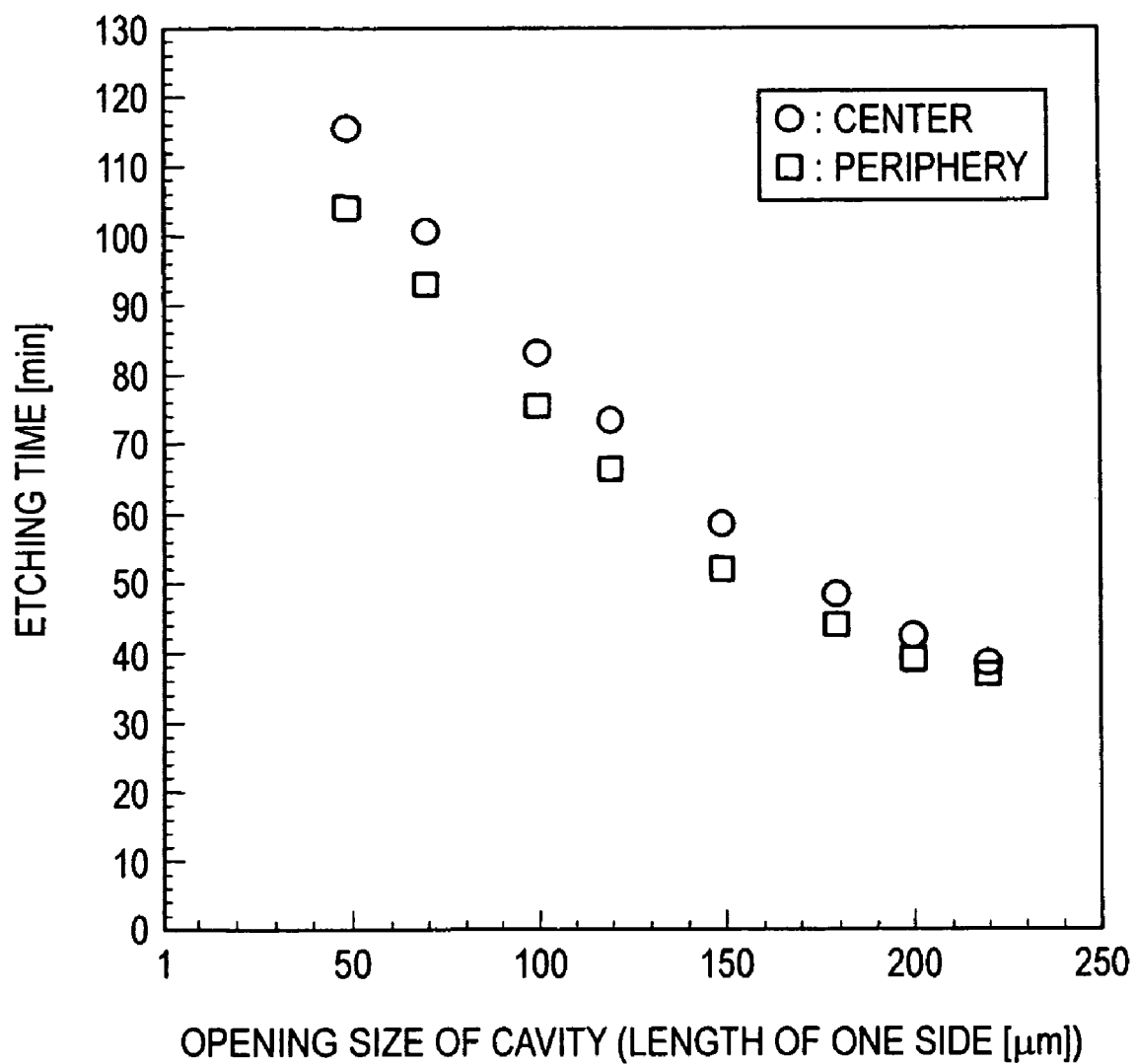
FIG. 24 is a graph showing the relation between the opening size of each cavity and the etching time in the second embodiment.

FIG. 24 shows the relation between the opening size of each cavity 2H shown in FIG. 23 and the etching time. A Si substrate having a thickness of 200 μm is used as the substrate 2. The cavities 2H are produced by Deep-RIE. When the cavities 2H are etched, a primer layer 201 (of a thermally oxidized Si film, see FIG. 8) formed on a front surface of the substrate 2 is used as an etching stopper layer. The distance between adjacent cavities 2H is set to be 30 μm. In FIG. 24, the horizontal axis expresses the opening size (length of one side: μm) of each cavity 2H, and the vertical axis expresses the etching time (minute).

As shown in FIG. 24, the etching time of the cavity 2H disposed in the center portion is longer than the etching time of each of the other cavities 2H disposed in the periphery. There is obtained a result that this tendency becomes remarkable as the opening size of the cavity 2H becomes small.

(2) Specific Structure of Filter and Thin-Film Piezoelectric Resonators

Figure 25:
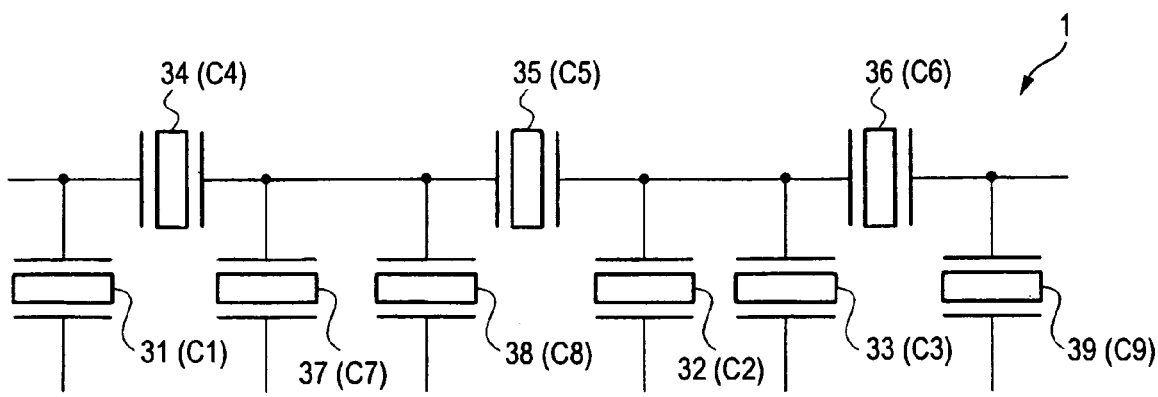
FIG. 25 is a circuit diagram of thin-film piezoelectric resonators and a filter according to the second embodiment.

As shown in FIG. 25, the filter 1 according to the second embodiment is formed of nine thin-film piezoelectric resonators 31 to 39 in total, using a structure in which thin-film piezoelectric resonators 34, 35 and 36 are electrically connected in series while thin-film piezoelectric resonators 31, 37, 38, 32, 33 and 39 are electrically connected in parallel. The respective capacitance ratios of the thin-film piezoelectric resonators 31 to 39 constituting the filter 1 are allocated as shown in FIG. 26.

EXAMPLE

Figure 27:
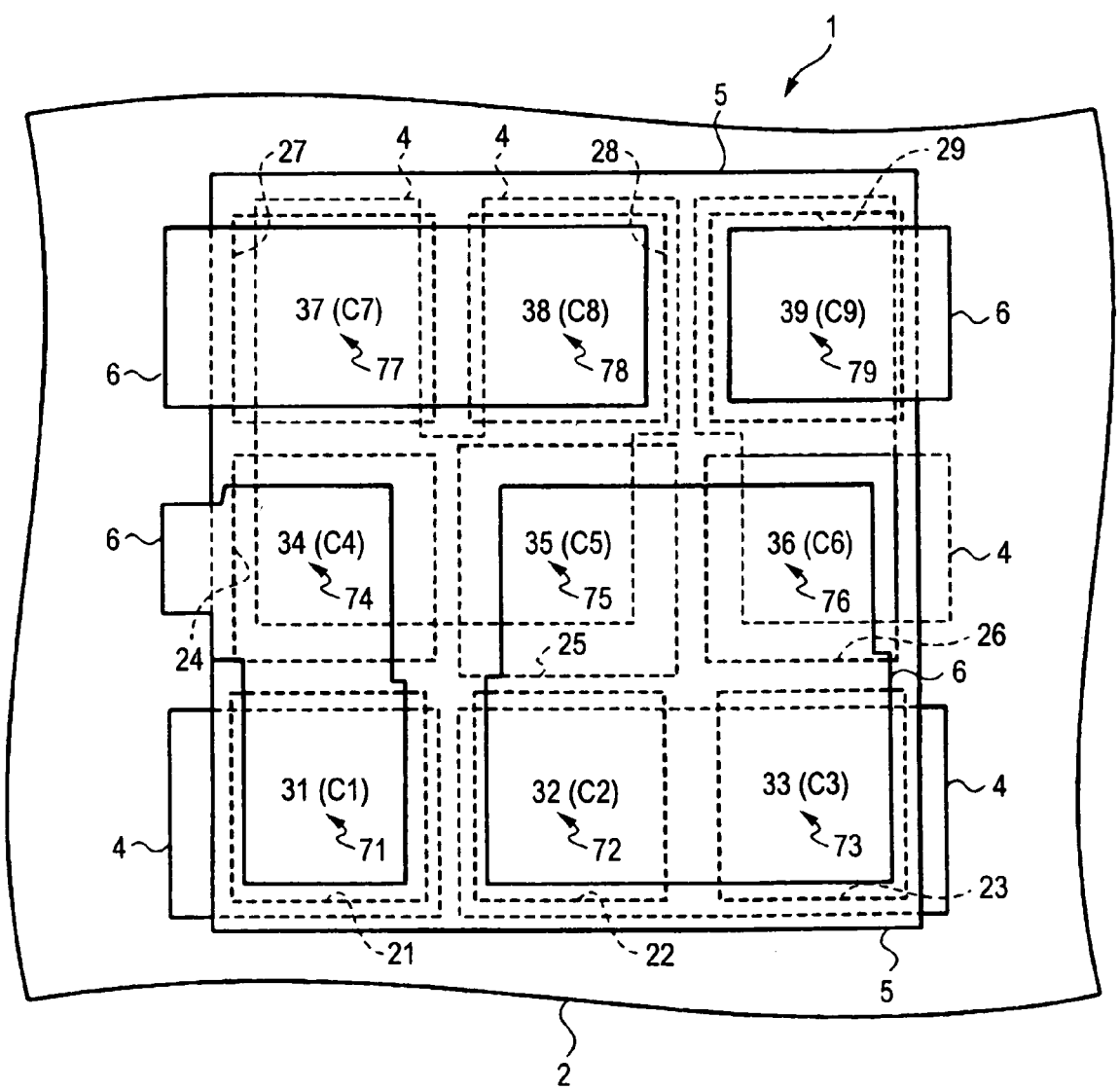
FIG. 27 is a plan view of thin-film piezoelectric resonators and a filter according to an example of the second embodiment.

The filter 1 according to an example of the second embodiment is produced on the basis of the results shown in FIG. 24. As shown in FIG. 27, each of excitation portions 71, 72, 73, 77, 78 and 79 of thin-film piezoelectric resonators 31, 32, 33, 37, 38 and 39 is formed into a square planar shape 165 µm on a side. Each of openings of cavities 21, etc. of these thin-film piezoelectric resonators 31, etc. is formed into a square opening shape 185 µm on a side. The average distance d is set to be 10 µm. Each of excitation portions 74 and 76 of thin-film piezoelectric resonators 34 and 36 is formed into a square planar shape 135 µm on a side. Each of openings of cavities 24, etc. of these thin-film piezoelectric resonators 34, etc. is formed into a square opening shape 185 µm on a side. The average distance d is set to be 25 µm.

A side of the cavity 25 of the thin-film piezoelectric resonator 35 disposed in the center is set to be 193 µm in order to make the etching time of the cavity 25 equal to the etching time of the other cavities 21, etc. 185 µm on a side. The cavity 25 is formed into a square planar shape with this size. The average distance d in the thin-film piezoelectric resonator 35 is set to be 29 µm. In each of all the thin-film piezoelectric resonators 31 to 39, a part of an end of the lower electrode 4 is disposed in the opening of the cavity 2H so that the parasitic capacitance value added to the lower electrode 4 is adjusted to "zero".

In the filter 1 designed as described above, each cavity 2H is produced by Deep-RIE from the rear surface toward the front surface of the substrate 2. The thickness of the substrate 2 to be etched is 200 µm. The etching time is about 43 minutes. On the assumption that a 6-inch wafer is used, an over-etching time of 1 minute 30 seconds is further added to the etching time. The amount of the notch generated at the time of over-etching is about 3 µm at the most. For example, if the alignment tolerance of the alignment apparatus is 5 µm at the most, the planar size of a portion of the lower electrode 4 bridging the cavity 2H is set to be larger by at least 8 µm than the opening size of the cavity 2H. Even in the case where the cavity 2H is designed to be larger than the required minimum size, the amount of the notch can be suppressed. Accordingly, the mechanical strength of the excitation portion 7 as a whole can be kept sufficient.

COMPARATIVE EXAMPLE

Figure 28:
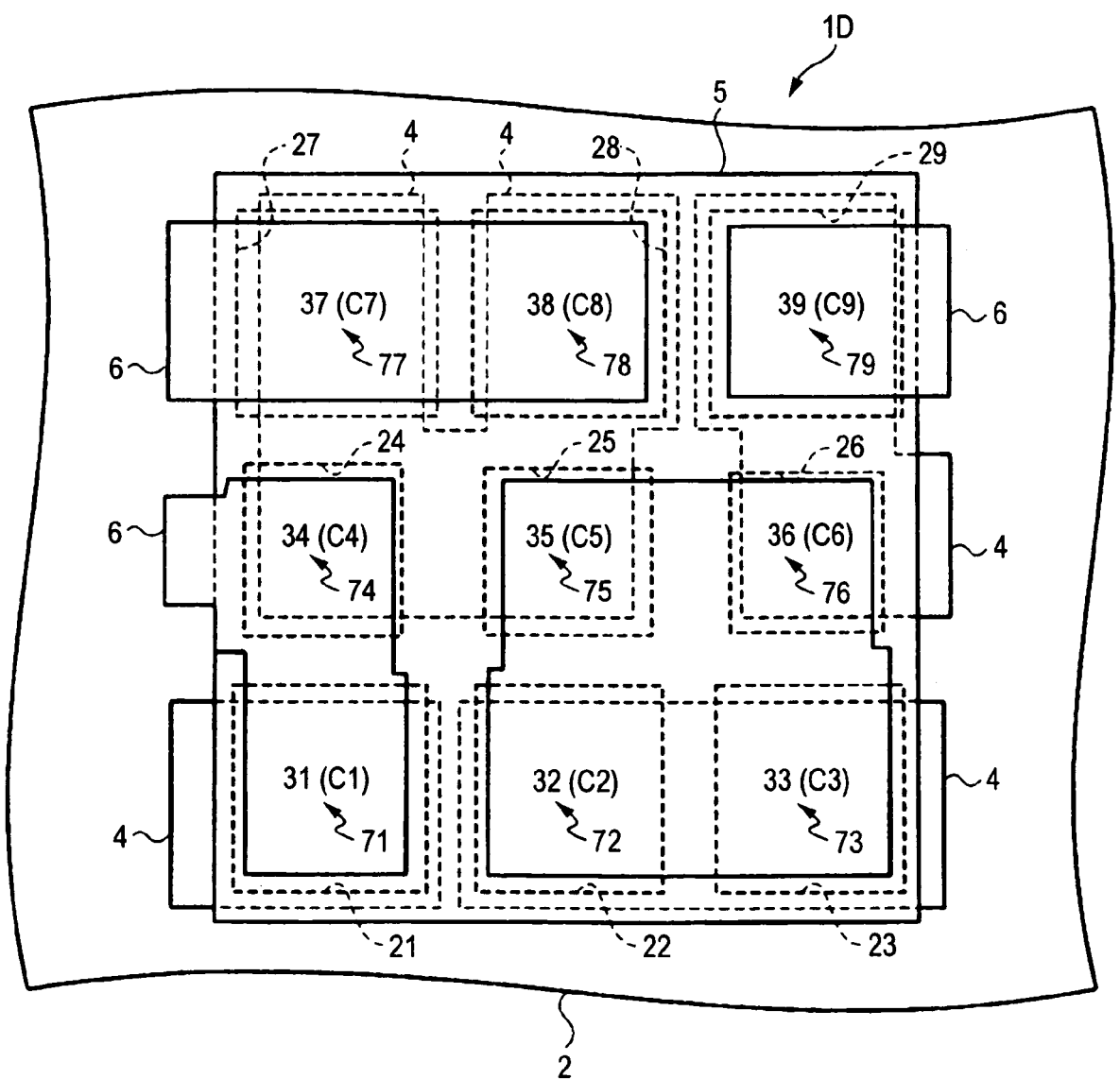
FIG. 28 is a plan view of thin-film piezoelectric resonators and a filter according to a comparative example of the second embodiment.

FIG. 28 shows a comparative example of the second embodiment. In thin-film piezoelectric resonators 3 of a filter 1D according to this comparative example, average distances d from ends of excitation portions 7 to opening ends of cavities 2H are equal in all the thin-film piezoelectric resonators 31 to 39. That is, the average distance d is set to be equal to d1, for example, 10 µm. Accordingly, each cavity 2H has a square opening shape having an opening size in which each side is in a range of from 155 µm to 185 µm.

In the filter 1D designed as described above, each cavity 2H is produced by Deep-RIE from the rear surface toward the front surface of the substrate 2. When the thickness of the substrate 2 to be etched is 200 µm and etching is performed based on the "condition 2" in which the area distribution is small as shown in FIG. 7, the time required for etching the cavities 2H which are in the thin-film piezoelectric resonators 3 disposed in the peripheral portion and each of which has an opening size 155 µm on a side is about 67 minutes as shown in FIG. 24. An over-etching time of 4 minutes must be further taken for etching the cavities 2H which are in the thin-film piezoelectric resonators 3 disposed in the peripheral portion and each of which has a large opening size. An over-etching time of 5 minutes must be further taken for etching the cavity 2H of the thin-film piezoelectric resonator 3 disposed in the center. On the assumption that a 6-inch wafer is used, an over-etching time of 1 minute 30 seconds is further added to the etching time. That is, the over-etching time is 10 minutes 30 seconds in total. As the amount of the notch, 21 µm is observed. A concavo-convex shape is generated at the opening end of the cavity 2H because of the generation of the large notch, so that breaking of the film of the excitation portion 7 due to concentration of stress on the concavo-convex portion is observed in a part of the substrate 2.

Effect of the Second Embodiment

In the filter 1 according to the second embodiment, change in etching speed due to the density of arrangement of the cavities 2H was observed when seven or more thin-film piezoelectric resonators 3 were arranged. Accordingly, when the number of cavities 2H arranged, the opening size of each cavity 2H, etc. are adjusted in accordance with etching characteristic of Deep-RIE, the over-etching time can be shortened.

Third Embodiment

A third embodiment of the invention will be described in connection with an example in which the invention is applied to thin-film piezoelectric resonators 3 and a filter 1 different in the sectional structure of cavities 2H disposed in the substrate 2.

(1) Method for Producing Thin-Film Piezoelectric Resonator

A method for producing thin-film piezoelectric resonators 3 and a filter 1 according to the third embodiment is performed as follows. First, cavities (hollows or concave portions) 2H are formed in the substrate 2 (see FIG. 29). Although the cavities 2H according to the first and second embodiments use through-holes piercing the substrate 2 from the rear surface to the front surface, the cavities 2H according to the third embodiment use bottomed holes with a predetermined depth from the front surface of the substrate 2.

Figure 29:
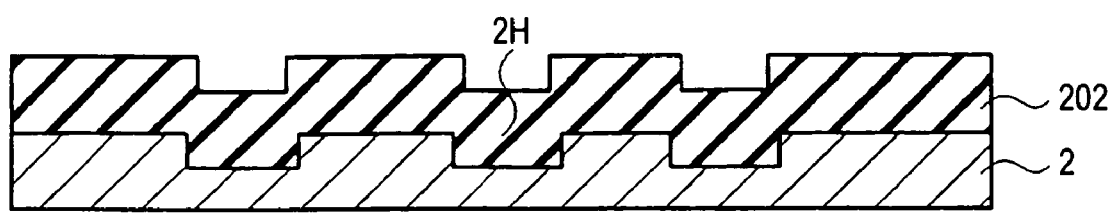
FIG. 29 is a first step sectional view for explaining a method for producing thin-film piezoelectric resonators and a filter according to a third embodiment of the invention.

As shown in FIG. 29, a sacrificial layer 202 is formed on the whole region of the front surface of the substrate 2. For example, a soft material such as a Si oxide film or an Al film formed by a CVD method or a sputtering method can be used as the sacrificial layer 202.

Figure 30:
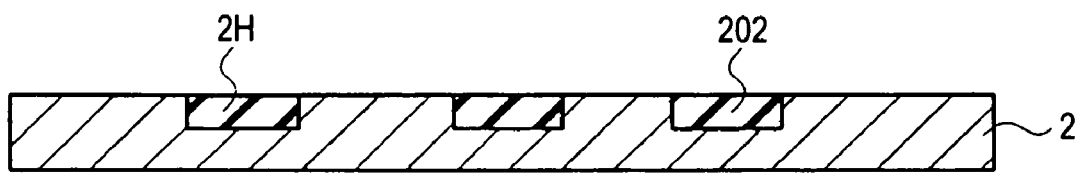
FIG. 30 is a second step sectional view.

As shown in FIG. 30, the sacrificial layer 202 is polished by a chemical mechanical polishing (CMP) technique till the front surface of the substrate 2 is exposed, so that the sacrificial layer 202 is embedded in the cavities 2H.

Then, a lower electrode 4, a piezoelectric material 5 and an upper electrode 6 are formed successively on the sacrificial layer 202 embedded in the cavities 2H in the same manner as in the process shown in FIGS. 8 to 10 concerned with the first embodiment. Thus, excitation portions 7 are formed in overlapping regions of these layers.

Figure 31:
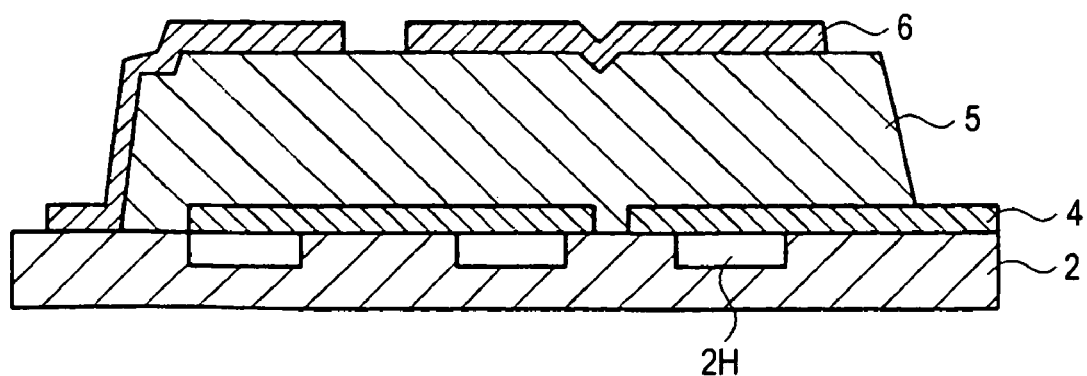
FIG. 31 is a third step sectional view.

As shown in FIG. 31, the sacrificial layer 202 is selectively removed, for example, by wet etching so that the cavities 2H become empty. When this process is completed, thin-film piezoelectric resonators 3 and a filter 1 according to the third embodiment can be finished.

In the CMP, a material softer than the material of the substrate 2 is often used as the material of the sacrificial layer 202. Accordingly, dishing, that is, generation of a hollow in the front surface of the sacrificial layer 202 embedded in each cavity 2H occurs easily when the front surface of the substrate 2 is exposed (see FIG. 41). The amount of dishing depends on the area of the sacrificial layer 202. When sacrificial layers 202 of various sizes are embedded, there is a tendency that the amount of dishing increase as the area of the sacrificial layer 202 increases. Moreover, erosion, that is, depression of a polished surface (see FIG. 42) occurs easily according to the density of arrangement of the sacrificial layers 202 (the density of arrangement of the cavities 2H). In the CMP, the window of the polishing condition in the case where the sacrificial layers 202 are embedded in the cavities 2H of the same pattern (the same opening size) is wider than the window of the polishing condition in the case where the sacrificial layers 202 are embedded in the cavities 2H of various patterns (various opening sizes). Therefore, when the filter 1 is designed to obtain the flatness of the polished surface finished by the CMP regardless of the planar sizes of the excitation portions 7 of the thin-film piezoelectric resonators 3 for the purpose of production of filters having various designs, the filtering characteristic of the filter 1 can be improved.

EXAMPLE

A filter 1 according to an example of the third embodiment is equivalent to the circuit configuration shown in FIG. 13. Capacitance values are allocated to the thin-film piezoelectric resonators 3 respectively as shown in FIG. 14.

Figure 32:
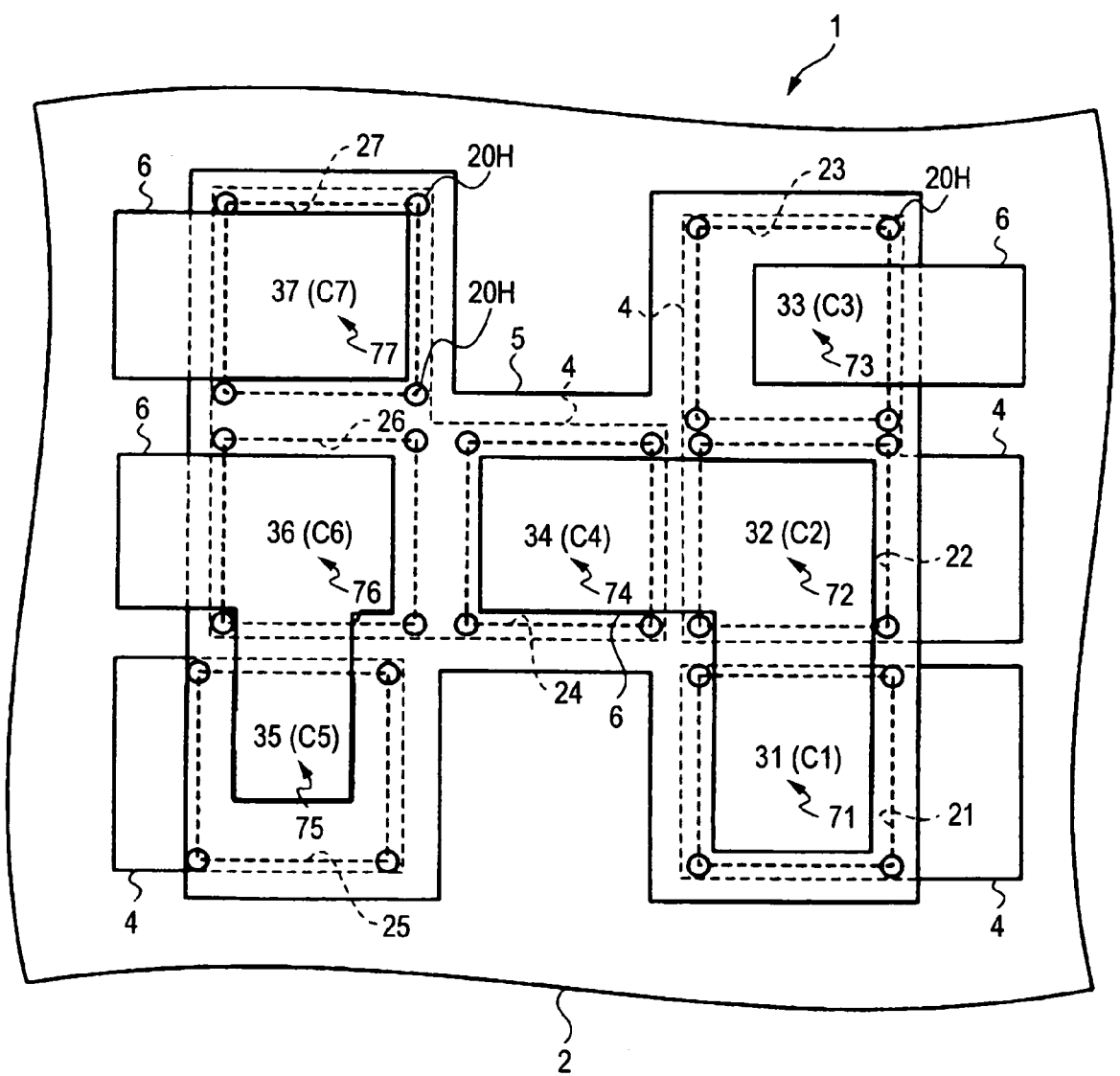
FIG. 32 is a plan view of thin-film piezoelectric resonators and a filter according to an example of the third embodiment.

As shown in FIG. 32, in the filter 1, the planar sizes of the sacrificial layers 202 (equivalent to the opening sizes of the cavities 2H) are set so that the flattest polished surface can be obtained in the CMP regardless of the planar sizes of the excitation portions 7 of the thin-film piezoelectric resonators 3. As a result, the planar size of the sacrificial layer 202 embedded in each of the cavities 2H of the thin-film piezoelectric resonators 3 disposed in the periphery is set to be different by a range of ±5% from the planar size of the sacrificial layer 202 embedded in the cavity 2H of the thin-film piezoelectric resonator 3 disposed in the center.

In observation of dishing and erosion after the CMP, the depression could be stopped in a range of 300 nm at the most in the direction of the depth of the substrate 2 from the front surface of the substrate 2. A lower electrode 4 was formed on the front surface of the sacrificial layer 202 embedded in the cavity 2H. An AlN piezoelectric thin film was further formed as a piezoelectric material 5 on the lower electrode 4. The AlN piezoelectric thin film was analyzed by X-ray diffraction. As a result, the half-value width of the rocking curve of AlN (0002) peak measured was 1.40.

An upper electrode 6 and a load electrode further were formed on the piezoelectric material 5. When the sacrificial layer 202 was then removed, a numerical value of 6.7% or more was obtained in measurement of the electromechanical coupling coefficient $k^2$ of the thin-film piezoelectric resonator 3. Moreover, the band width reached 70 MHz. A filter 1 having good filtering characteristic could be achieved.

COMPARATIVE EXAMPLE

Figure 33:
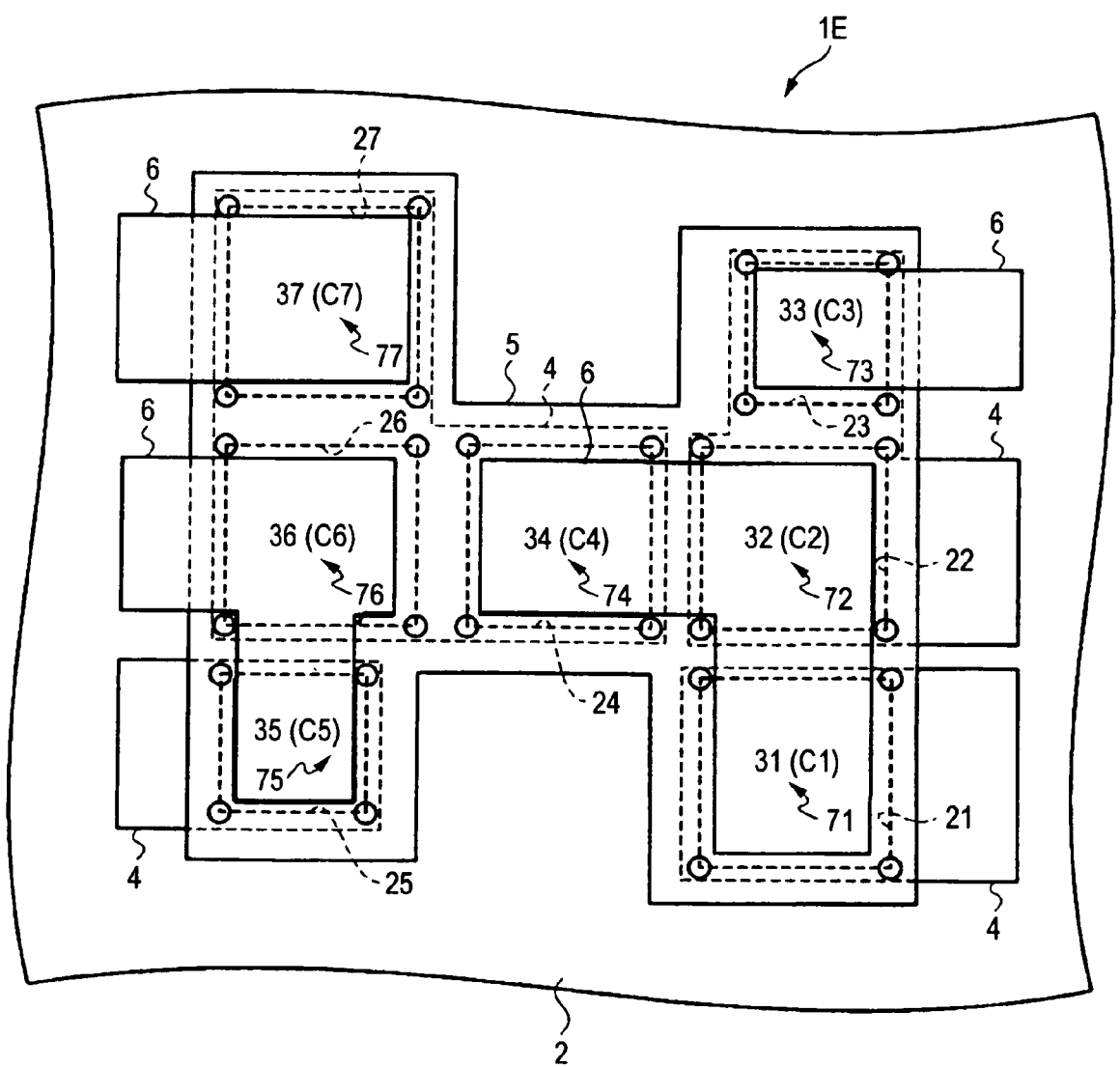
FIG. 33 is a plan view of thin-film piezoelectric resonators and a filter according to a comparative example of the third embodiment.

FIG. 33 shows a comparative example of the third embodiment. In thin-film piezoelectric resonators 3 of a filter 1E according to this comparative example, average distances d from ends of excitation portions 7 to opening ends of cavities 2H (contours of sacrificial layers 202) are the same in all the thin-film piezoelectric resonators 31 to 37. That is, the average distance d is set to be equal to d1, for example, 5 μm. As a result, the planar size of the sacrificial layer 202 embedded in each of the cavities 2H of the thin-film piezoelectric resonators 3 disposed in the periphery was different by a range of ±16% from the planar size of the sacrificial layer 202 embedded in the cavity 2H of the thin-film piezoelectric resonator 3 disposed in the center.

In observation of dishing and erosion after the CMP, the depression in the direction of the depth of the substrate 2 from the front surface of the substrate 2 reached 2 μm at the most. The piezoelectric thin film was analyzed by X-ray diffraction in the same manner as in the example. As a result, the half-value width of the rocking curve of AlN(0002) peak measured was 4.3°. Moreover, the electromechanical coupling coefficient k measured was 3.7%. The band width required of the filter 1 could not be obtained sufficiently.

Fourth Embodiment

A fourth embodiment of the invention will be described in connection with an example in which the invention is applied to thin-film piezoelectric resonators 3 and a filter 1 provided with acoustic reflection layers disposed in a substrate 2'.

(1) Method for Producing Thin-Film Piezoelectric Resonator

A method for producing thin-film piezoelectric resonators 3 and a filter 1 according to the fourth embodiment is performed as follows. First, cavities (hollows or concave portions) 2H are formed in the substrate 2 (see FIG. 34).

Figure 34:
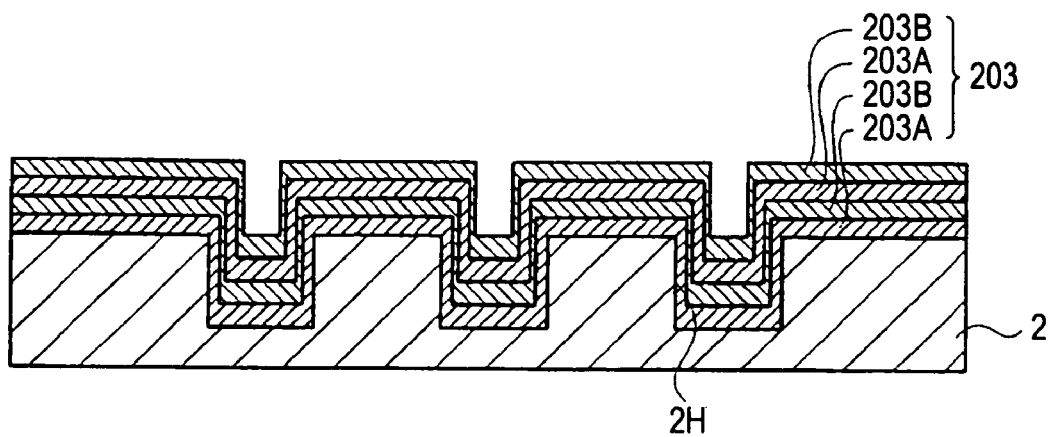
FIG. 34 is a first step sectional view for explaining a method for producing thin-film piezoelectric resonators and a filter according to a fourth embodiment of the invention.

As shown in FIG. 34, an acoustic reflection layer 203 is formed on the whole region of the front surface of the substrate 2. The acoustic reflection layer 203 is a composite film prepared in such a manner that low acoustic impedance layers 203A and high acoustic impedance layers 203B are laminated alternately by film thicknesses of a quarter wavelength of a required resonance frequency. For example, a Si oxide film can be used as each of the low acoustic impedance layers 203A whereas a W film can be used as each of the high acoustic impedance layers 203B.

Figure 35:
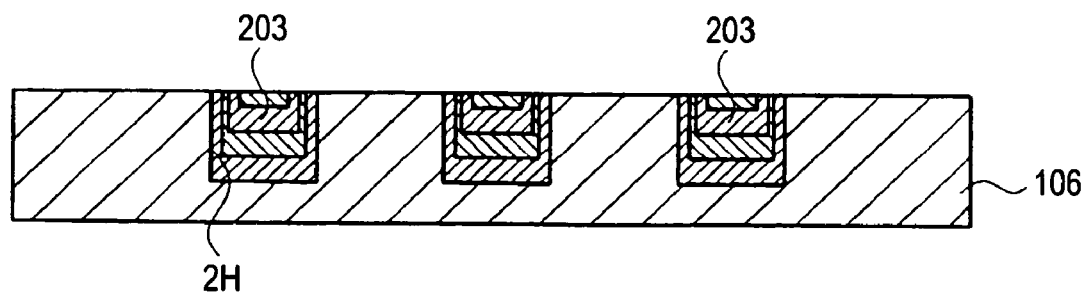
FIG. 35 is a second step sectional view.

As shown in FIG. 35, the acoustic reflection layer 203 is polished by CPM till the front surface of the substrate 2 is exposed, so that the acoustic reflection layer 203 is embedded in the cavities 2H.

Figure 36:
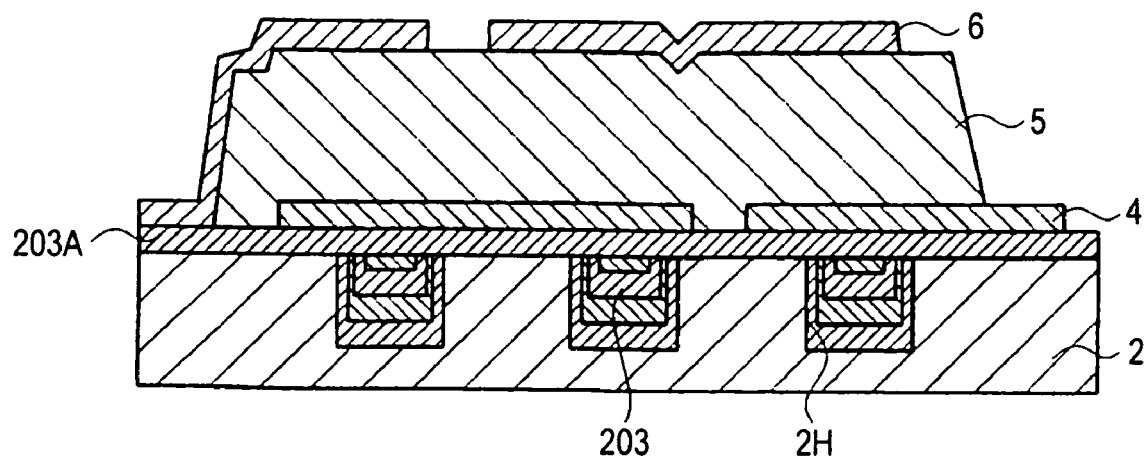
FIG. 36 is a third step sectional view.

Then, as shown in FIG. 36, a lower electrode 4, a piezoelectric material 5 and an upper electrode 6 are formed successively on the acoustic reflection layer 203 embedded in the cavities 2H in the same manner as in the process shown in FIGS. 8 to 10 concerned with the first embodiment. Thus, excitation portions 7 are formed in overlapping regions of these layers. When this process is completed, thin-film piezoelectric resonators 3 and a filter 1 according to the fourth embodiment can be finished.

In the CMP, a material softer than the material of the substrate 2 is often used as the material of the acoustic reflection layer 203. Accordingly, dishing, that is, generation of a hollow in the front surface of the acoustic reflection layer 203 embedded in each cavity 2H occurs easily when the front surface of the substrate 2 is exposed (see FIG. 41). The amount of dishing depends on the area of the acoustic reflection layer 203. When acoustic reflection layers 203 of various sizes are embedded, there is a tendency that the amount of dishing increase as the area of the acoustic reflection layer 203 increases. Moreover, erosion, that is, depression of a polished surface (see FIG. 42) occurs easily according to the density of arrangement of the acoustic reflection layers 203 (the density of arrangement of the cavities 2H). In the CMP, the window of the polishing condition in the case where the acoustic reflection layers 203 are embedded in the cavities 2H of the same pattern (the same opening size) is wider than the window of the polishing condition in the case where the acoustic reflection layers 203 are embedded in the cavities 2H of various patterns (various opening sizes). Therefore, when the filter 1 is designed to obtain the flatness of the polished surface finished by the CMP regardless of the planar sizes of the excitation portions 7 of the thin-film piezoelectric resonators 3 for the purpose of production of filters having various designs, the filtering characteristic of the filter 1 can be improved.

If the layer thickness of the acoustic reflection layer 203 changes because of dishing or erosion, lowering of reflectivity of piezoelectric vibration is brought so that the Q value of the thin-film piezoelectric resonator 3 is lowered. For this reason, sufficient filtering characteristic cannot be obtained.

EXAMPLE

A filter 1 according to an example of the fourth embodiment is equivalent to the circuit configuration shown in FIG. 13. Capacitance values are allocated to the thin-film piezoelectric resonators 3 respectively as shown in FIG. 14.

Figure 37:
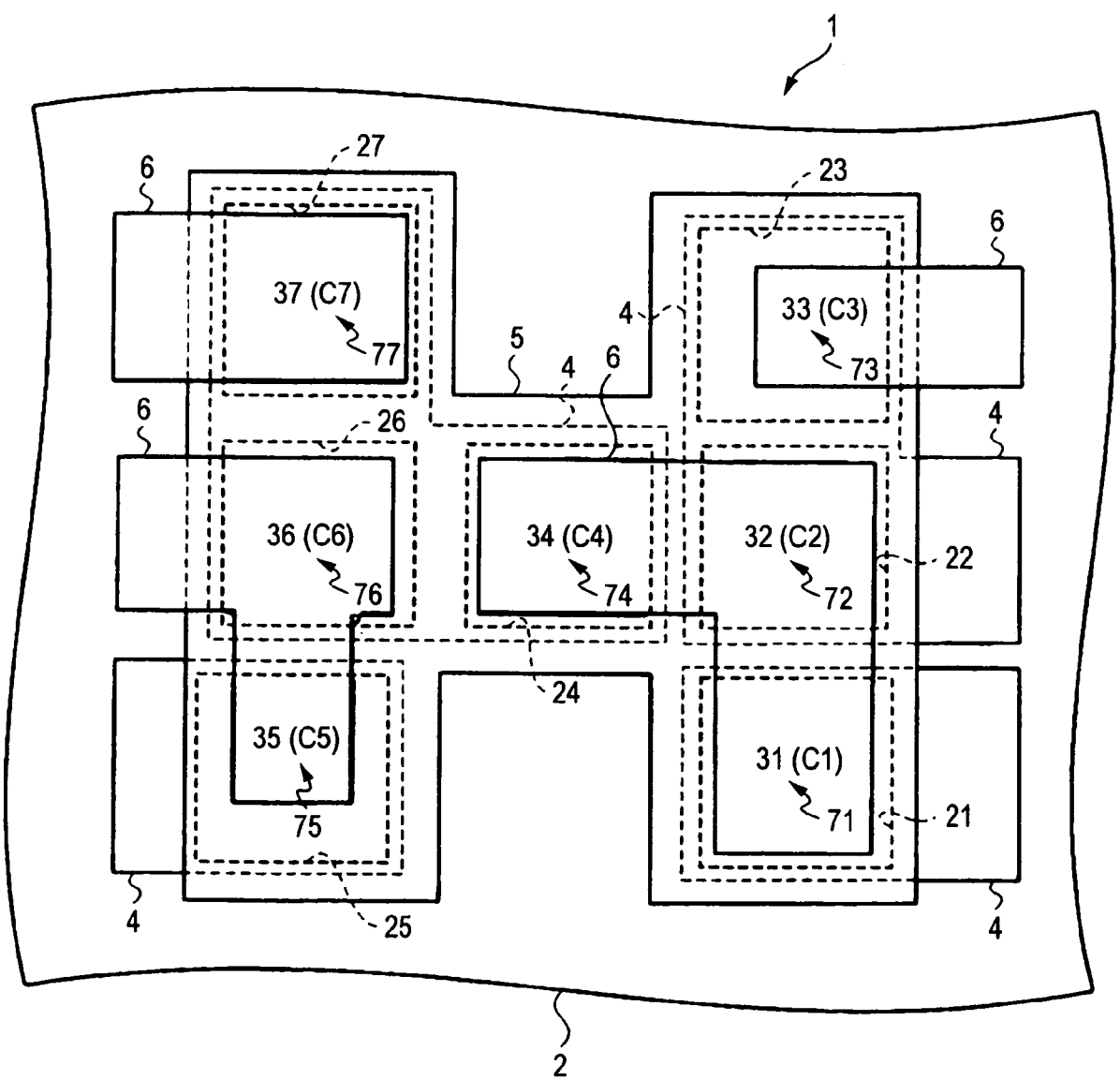
FIG. 37 is a plan view of thin-film piezoelectric resonators and a filter according to an example of the fourth embodiment.

As shown in FIG. 37, in the filter 1, the planar sizes of the acoustic reflection layers 203 (equivalent to the opening sizes of the cavities 2H) are set so that the flattest polished surface can be obtained in the CMP regardless of the planar sizes of the excitation portions 7 of the thin-film piezoelectric resonators 3. As a result, the planar size of the acoustic reflection layer 203 embedded in each of the cavities 2H of the thin-film piezoelectric resonators 3 disposed in the periphery is set to be different by a range of ±5% from the planar size of the acoustic reflection layer 203 embedded in the cavity 2H of the thin-film piezoelectric resonator 3 disposed in the center portion.

In observation of dishing and erosion after the CMP, the depression could be stopped in a range of 300 nm at the most in the direction of the depth of the substrate 2 from the front surface of the substrate 2. A lower electrode 4 was formed on the front surface of the acoustic reflection layer 203 embedded in the cavity 2H. An AlN piezoelectric thin film was further formed as a piezoelectric material 5 on the lower electrode 4. The AlN piezoelectric thin film was analyzed by X-ray diffraction. As a result, the half-value width of the rocking curve of AlN(0002) peak measured was 1.4°.

An upper electrode 6 and a load electrode were further formed on the piezoelectric material 5 to thereby produce the filter 1. A numerical value of 5.5% or more was obtained in measurement of the electromechanical coupling coefficient $k^2$ of the thin-film piezoelectric resonator 3 of the produced filter 1. Moreover, the Q value was about 700, so that the pass band attenuation of the filter reached 2 dB. A filter 1 having good filtering characteristic could be achieved.

COMPARATIVE EXAMPLE

Figure 38:
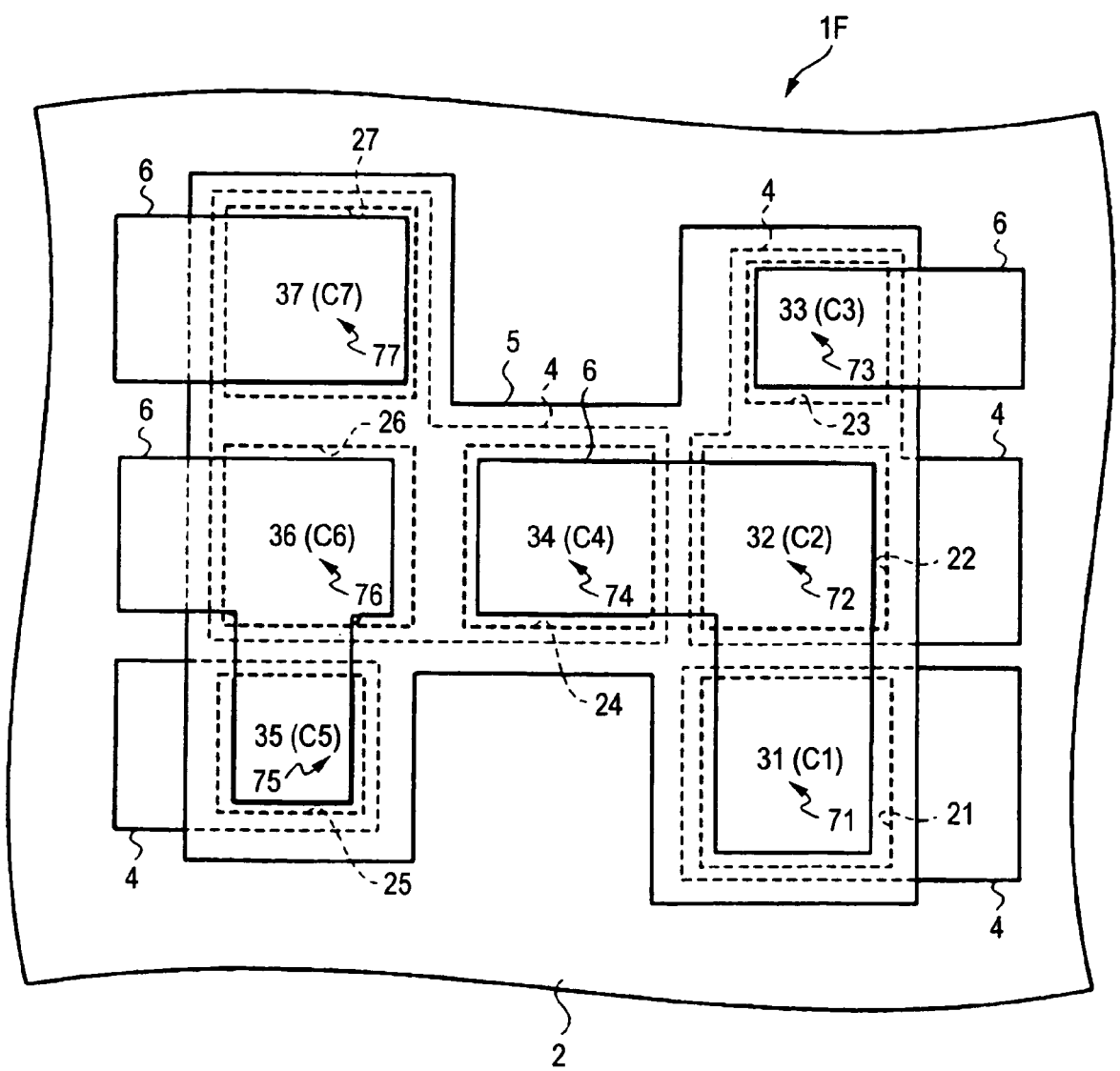
FIG. 38 is a plan view of thin-film piezoelectric resonators and a filter according to a comparative example of the fourth embodiment.
Figure 39:
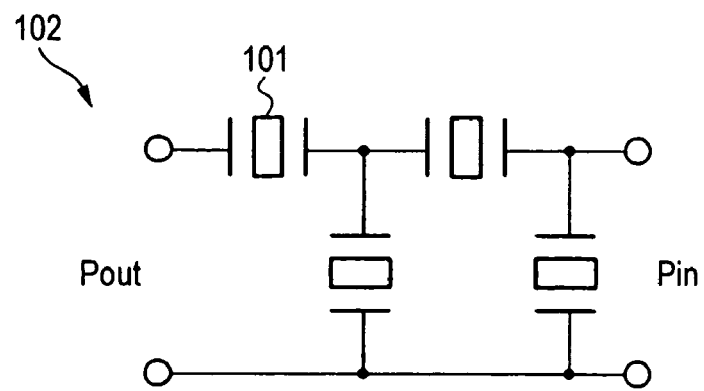
FIG. 39 is a circuit diagram of a ladder-type filter according to the background art.
Figure 40:
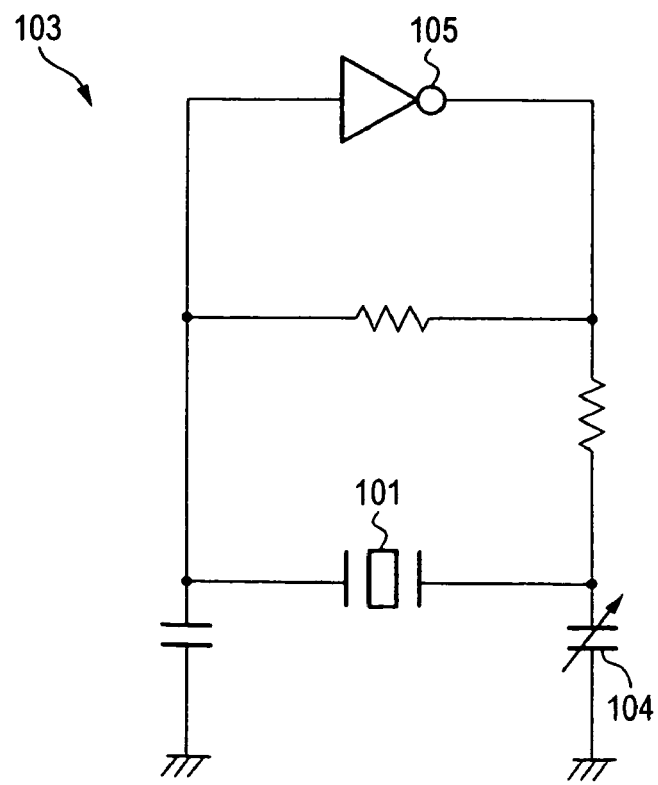
FIG. 40 is a circuit diagram of a VCO according to the background art.

FIG. 38 shows a comparative example of the fourth embodiment. In thin-film piezoelectric resonators 3 of a filter 1F according to this comparative example, average distances d from ends of excitation portions 7 to opening ends of cavities 2H (contours of acoustic reflection layers 203) are the same in all the thin-film piezoelectric resonators 31 to 37. That is, the average distance d is set to be equal to d1, for example, 5 µm. As a result, the planar size of the acoustic reflection layer 203 embedded in each of the cavities 2H of the thin-film piezoelectric resonators 3 disposed in the periphery was different by a range of ±16% from the planar size of the acoustic reflection layer 203 embedded in the cavity 2H of the thin-film piezoelectric resonator 3 disposed in the center.

In observation of dishing and erosion after the CMP, the depression in the direction of the depth of the substrate 2 from the front surface of the substrate 2 reached 2 µm at the most. The piezoelectric thin film was analyzed by X-ray diffraction in the same manner as in the example. As a result, the half-value width of the rocking curve of AlN(0002) peak measured was 4.3°. Moreover, when the electromechanical coupling coefficient $k^2$ was measured, a numerical value of 2.7% or more was obtained. Moreover, the Q value was about 300. The pass band attenuation of the filter and the amount of band attenuation were unsuitable.

Incidentally, the invention is not limited to the embodiments and changes may be made without departing from the gist of the invention. For example, the invention can be applied not only to the thin-film piezoelectric resonators and the filter but also to a filter-including apparatus, specifically, a voltage-controlled oscillator.

What is claimed is:

1. A thin-film piezoelectric filter comprising:
   a substrate including a first cavity and a second cavity disposed separately from each other;
   a first excitation portion disposed over the first cavity, the first excitation portion including a first electrode, a first piezoelectric material and a second electrode laminated successively, an overlapping region among the first electrode, the first piezoelectric material and the second electrode defining a contour of a periphery of the first excitation portion, a first distance defined as a distance from an end of the first excitation portion to an opening end of the first cavity; and
   a second excitation portion disposed over the second cavity, the second excitation portion including a third electrode, a second piezoelectric material and a fourth electrode laminated successively, an overlapping region among the third electrode, the second piezoelectric material and the fourth electrode defining a contour of a periphery of the second excitation portion, a second distance defined as a distance from an end of the second excitation portion to an opening end of the second cavity, the second distance being different from the first distance, the second distance, less an alignment tolerance, is longer than the first distance.

2. The thin-film piezoelectric filter according to claim 1, wherein the first electrode and the third electrode are formed of a same layer, the first piezoelectric material and the second piezoelectric material are formed of a same layer, and the second electrode and the fourth electrode are formed of a same layer.

3. The thin-film piezoelectric filter according to claim 1, wherein an opening shape of the first cavity is the same as an opening shape of the second cavity, and an opening size of the first cavity is the same as an opening size of the second cavity.

4. The thin-film piezoelectric filter according to claim 1, wherein the second excitation portion includes a plurality of second excitation portions, and an opening size of the first cavity is larger than an opening size of each of the second cavities.

5. The thin-film piezoelectric filter according to claim 4, wherein a number of the second excitation portions is equal to or greater than 6.

6. A filter comprising:
a substrate including a first cavity and a second cavity disposed separately from each other;
a first thin-film piezoelectric resonator including a first excitation portion disposed over the first cavity, the first excitation portion including a first electrode, a first piezoelectric material and a second electrode laminated successively, an overlapping region among the first electrode, the first piezoelectric material and the second electrode defining a contour of a periphery of the first excitation portion, a first distance defined as a distance from an end of the first excitation portion to an opening end of the first cavity; and
a second thin-film piezoelectric resonator including a second excitation portion disposed over the second cavity, the second excitation portion including a third electrode, a second piezoelectric material and a fourth electrode laminated successively, an overlapping region among the third electrode, the second piezoelectric material and the fourth electrode defining a contour of a periphery of the second excitation portion, a second distance defined as a distance from an end of the second excitation portion to an opening end of the second cavity, the second distance being different from the first distance, the second distance, less an alignment tolerance, is longer than the first distance.

7. A thin-film piezoelectric resonator comprising:
a substrate including a first acoustic reflection layer and a second acoustic reflection layer disposed separately from each other;
a first excitation portion disposed on the first acoustic reflection layer, the first excitation portion including a first electrode, a first piezoelectric material and a second electrode laminated successively, an overlapping region among the first electrode, the first piezoelectric material and the second electrode defining a contour of a periphery of the first excitation portion, a first distance defined as a distance from an end of the first excitation portion to a contour end of the first acoustic reflection layer; and
a second excitation portion disposed on the second acoustic reflection layer, the second excitation portion including a third electrode, a second piezoelectric material and a fourth electrode laminated successively, an overlapping region among the third electrode, the second piezoelectric material and the fourth electrode defining a contour of a periphery of the second excitation portion, a second distance defined as a distance from an end of the second excitation portion to a contour end of the second acoustic reflection layer, the second distance being different from the first distance.

8. The thin-film piezoelectric resonator according to claim 7, wherein a contour shape of the first acoustic reflection layer is the same as a contour shape of the second acoustic reflection layer, and a contour size of the first acoustic reflection layer is the same as a contour size of the second acoustic reflection layer.

9. The thin-film piezoelectric resonator according to claim 7, wherein the second excitation portion includes a plurality of second excitation portions, and contour sizes of the second reflection layers are in a range of 95% of a contour size of the first reflection layer to 105% of the contour size of the first reflection layer.

10. A filter comprising:
a substrate including a first acoustic reflection layer and a second acoustic reflection layer disposed separately from each other;
a first thin-film piezoelectric resonator including a first excitation portion disposed on the first acoustic reflection layer, the first excitation portion including a first electrode, a first piezoelectric material and a second electrode laminated successively, an overlapping region among the first electrode, the first piezoelectric material and the second electrode defining a contour of a periphery of the first excitation portion, a first distance defined as a distance from an end of the first excitation portion to a contour end of the first acoustic reflection layer; and
a second thin-film piezoelectric resonator including a second excitation portion disposed on the second acoustic reflection layer, the second excitation portion including a third electrode, a second piezoelectric material and a fourth electrode laminated successively, an overlapping region among the third electrode, the second piezoelectric material and the fourth electrode defining a contour of a periphery of the second excitation portion, a second distance defined as a distance from an end of the second excitation portion to a contour end of the second acoustic reflection layer, the second distance being different from the first distance.

11. The filter according to claim 10, wherein:
a contour shape of the first acoustic reflection layer is the same as a contour shape of the second acoustic reflection layer; and
a contour size of the first acoustic reflection layer is the same as a contour size of the second acoustic reflection layer.

* * * * *